(12) United States Patent
Mitsuhashi

(10) Patent No.: US 9,478,481 B2
(45) Date of Patent: Oct. 25, 2016

(54) SEMICONDUCTOR DEVICE, METHOD FOR MANUFACTURING SAME, AND ELECTRONIC COMPONENT

(71) Applicant: ROHM CO., LTD., Kyoto (JP)

(72) Inventor: Toshiro Mitsuhashi, Tokyo (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/345,234

(22) PCT Filed: Nov. 14, 2012

(86) PCT No.: PCT/JP2012/079509
§ 371 (c)(1),
(2) Date: Mar. 14, 2014

(87) PCT Pub. No.: WO2013/073574
PCT Pub. Date: May 23, 2013

(65) Prior Publication Data
US 2014/0346668 A1 Nov. 27, 2014

(30) Foreign Application Priority Data
Nov. 15, 2011 (JP) ................... 2011-249939

(51) Int. Cl.
*H01L 23/485* (2006.01)
*H01L 29/40* (2006.01)
(Continued)

(52) U.S. Cl.
CPC ....... *H01L 23/485* (2013.01); *H01L 21/28158* (2013.01); *H01L 21/486* (2013.01); *H01L 21/76877* (2013.01); *H01L 21/76898* (2013.01); *H01L 23/147* (2013.01); *H01L 23/481* (2013.01); *H01L 23/49827* (2013.01); *H01L 24/10* (2013.01); *H01L 25/065* (2013.01); *H01L 25/0657* (2013.01); *H01L 25/07* (2013.01); *H01L 25/18* (2013.01); *H01L 29/40* (2013.01);
(Continued)

(58) Field of Classification Search
CPC H01L 2224/16; H01L 23/532; H01L 21/768
USPC .............. 257/305, 432, 750, 737, 751, 774; 438/667, 585
See application file for complete search history.

(56) References Cited

U.S. PATENT DOCUMENTS 5,739,587 A 4/1998 Sato
8,008,195 B2 * 8/2011 Koike et al. .................. 438/667
(Continued)

FOREIGN PATENT DOCUMENTS

CN 101159273 A 4/2008
JP 08-293523 A 11/1996
(Continued)

*Primary Examiner* — Peniel M Gumedzoe
(74) *Attorney, Agent, or Firm* — Rabin & Berdo, P.C.

(57) ABSTRACT

An electrode layer is formed on a gate insulating film. An interlayer insulating film is formed on the gate insulating firm. A lower pad is formed by a damascene method. Next, a through hole is formed, and a first interlayer insulating film, which is provided with a projected portion that is in the same pattern as a lower insulating film, is exposed within the through hole at the same time. After etching the first interlayer insulating film so that a part of the projected portion remains as an etching residue, a via insulating film is formed and the via insulating film at the bottom of the through hole is etched. After that, a through electrode is formed by plating an electrode material on the inner side of the via insulating film on the through hole.

12 Claims, 25 Drawing Sheets

(51) Int. Cl.
  *H01L 21/768* (2006.01)
  *H01L 21/28* (2006.01)
  *H01L 21/48* (2006.01)
  *H01L 23/48* (2006.01)
  *H01L 23/00* (2006.01)
  *H01L 25/065* (2006.01)
  *H01L 25/07* (2006.01)
  *H01L 25/18* (2006.01)
  *H01L 23/14* (2006.01)
  *H01L 23/498* (2006.01)
  *H01L 23/31* (2006.01)

(52) U.S. Cl.
  CPC ........ *H01L 23/3114* (2013.01); *H01L 23/3128* (2013.01); *H01L 2224/16145* (2013.01); *H01L 2224/16225* (2013.01); *H01L 2224/16235* (2013.01); *H01L 2224/17181* (2013.01); *H01L 2924/13091* (2013.01); *H01L 2924/15311* (2013.01); *H01L 2924/15788* (2013.01)

(56) References Cited

U.S. PATENT DOCUMENTS

| | | | |
|---|---|---|---|
| 8,183,678 B2* | 5/2012 | Lee et al. | 257/686 |
| 2004/0043615 A1 | 3/2004 | Yamamoto et al. | |
| 2006/0006539 A1* | 1/2006 | Matsui et al. | 257/758 |
| 2007/0023887 A1* | 2/2007 | Matsui | 257/686 |
| 2007/0181991 A1 | 8/2007 | Ishino et al. | |
| 2008/0083927 A1 | 4/2008 | Nishiura et al. | |
| 2009/0200679 A1 | 8/2009 | Harada et al. | |
| 2009/0302430 A1 | 12/2009 | Takahashi et al. | |
| 2010/0327383 A1* | 12/2010 | Hayasaki et al. | 257/432 |
| 2011/0024849 A1 | 2/2011 | Akiyama | |
| 2011/0057326 A1* | 3/2011 | Kai et al. | 257/774 |
| 2011/0068476 A1 | 3/2011 | Kawasaki et al. | |
| 2011/0084385 A1* | 4/2011 | Itaya | H01L 21/563 257/737 |
| 2011/0084400 A1 | 4/2011 | Fujii | |
| 2011/0089571 A1 | 4/2011 | Matsuo | |
| 2011/0254165 A1* | 10/2011 | Muranaka | 257/751 |
| 2012/0199970 A1* | 8/2012 | Yun | H01L 23/481 257/737 |
| 2012/0248602 A1 | 10/2012 | Takahashi et al. | |
| 2012/0276736 A1* | 11/2012 | Idani | H01L 21/76816 438/642 |
| 2013/0328188 A1 | 12/2013 | Fujii | |

FOREIGN PATENT DOCUMENTS

| | | |
|---|---|---|
| JP | 2004-095849 A | 3/2004 |
| JP | 2007-036104 A | 2/2007 |
| JP | 2007-194444 A | 8/2007 |
| JP | 2009-164481 A | 7/2009 |
| JP | 2009-295851 A | 12/2009 |
| JP | 2011-009645 A | 1/2011 |
| JP | 2011-029491 A | 2/2011 |
| JP | 2011-071239 A | 4/2011 |
| JP | 2011-086773 A | 4/2011 |
| JP | 2011-086850 A | 4/2011 |
| JP | 2011-100963 A | 5/2011 |
| JP | 2011-108690 A | 6/2011 |
| JP | 2011-228419 A | 11/2011 |
| WO | WO-2010/070826 A1 | 6/2010 |

* cited by examiner

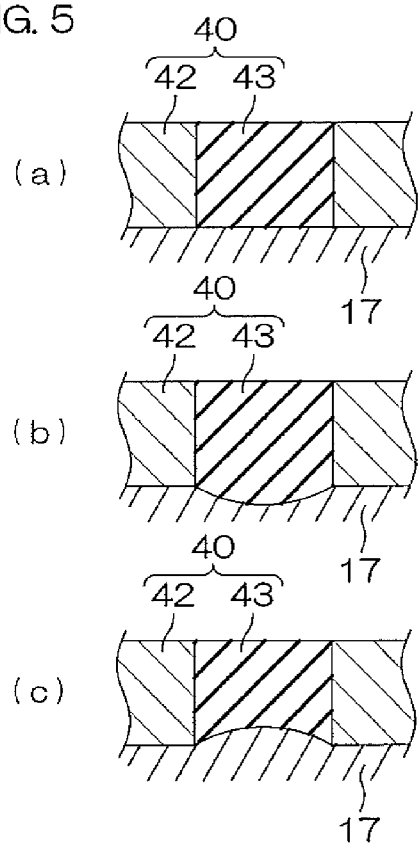
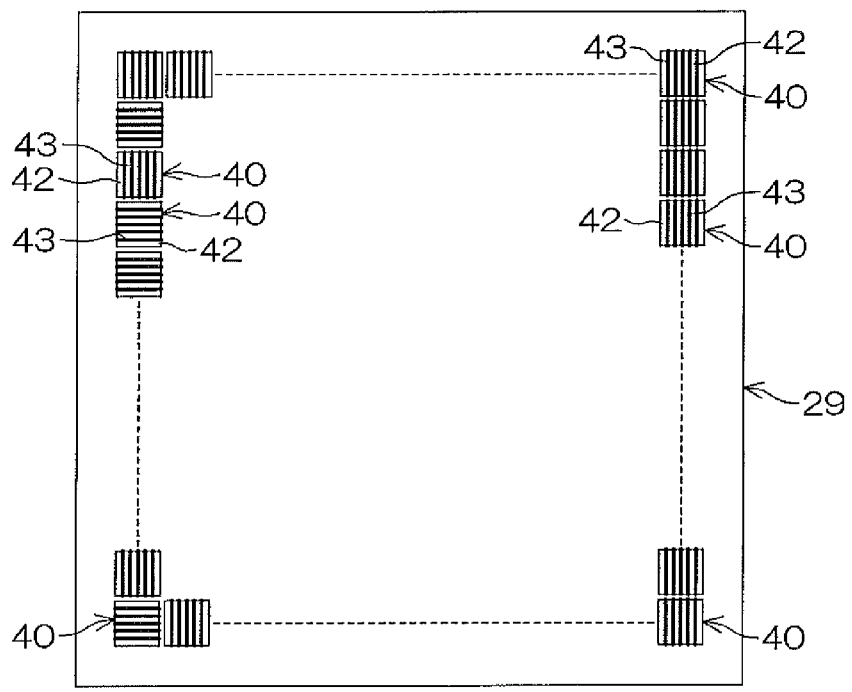

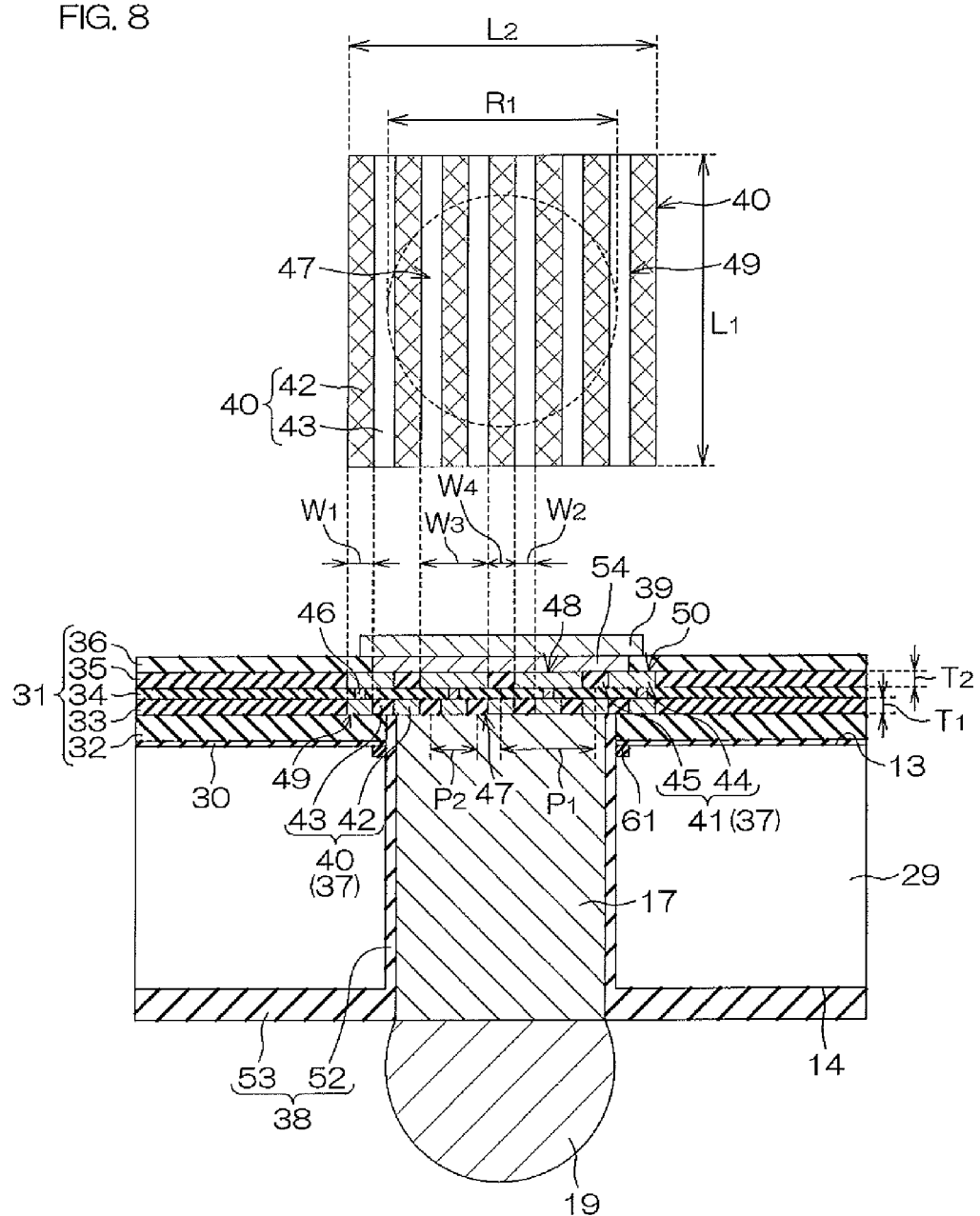

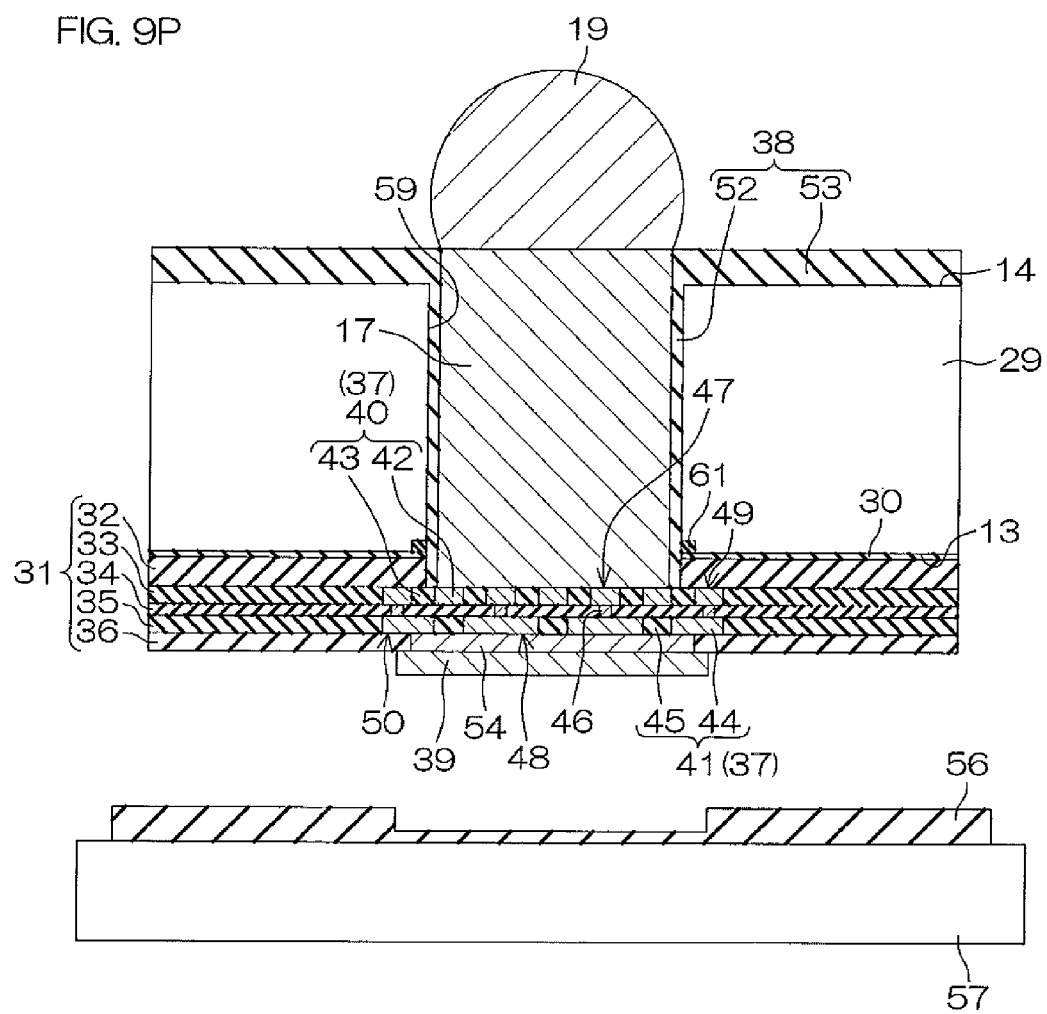

SEMICONDUCTOR DEVICE, METHOD FOR MANUFACTURING SAME, AND ELECTRONIC COMPONENT

TECHNICAL FIELD

The present invention relates to a semiconductor device having through electrodes, a method for manufacturing the semiconductor device, and an electronic component (package) provided with the semiconductor device.

BACKGROUND ART

In recent years, a technique has been developed for producing an electronic component, which is small in size, which is large in capacity, and which is high in performance, by stacking together a plurality of semiconductor devices each of which has through electrodes.

A semiconductor device having through electrodes is disclosed by, for example, Patent Literatures 1 and 2.

Each of the semiconductor devices of Patent Literatures 1 and 2 includes an Si substrate, through electrodes provided in the Si substrate, electrode pads formed on a surface of the Si substrate, and a rearrangement wiring layer formed on the electrode pads.

This semiconductor device is manufactured according to, for example, the following method. First, an electrode pad is formed on the surface of the Si substrate with an insulating film therebetween, and a rearrangement wiring layer is formed. Thereafter, dry etching is performed from the reverse surface of the Si substrate to a halfway point of the Si substrate by use of a first etching gas ($SF_6$). Subsequently, a remaining part of the Si substrate is removed by dry etching using a second etching gas ($C_4F_8$), and, as a result, a through hole that reaches the electrode pad is formed. Thereafter, an insulating film is formed on the side surface of the through hole, and a through electrode is formed inside the insulating film. A semiconductor device having through electrodes can be obtained through these steps.

CITATION LIST

Patent Literature

PTL 1: Japanese Unexamined Patent Publication No. 2011-86773
PTL 2: Japanese Unexamined Patent Publication No. 2011-86850

SUMMARY OF INVENTION

Technical Problem

An object of the present invention is to provide a semiconductor device that is capable of preventing the occurrence of voids in a through electrode and that has higher reliability in comparison to conventional semiconductor devices and to provide a method for manufacturing the semiconductor device.

Another object of the present invention is to provide an electronic component that is capable of preventing the occurrence of voids in a through electrode of a semiconductor device and that has higher reliability in comparison to conventional semiconductor devices.

Solution to Problem

The semiconductor device of the present invention includes a semiconductor substrate, a gate insulating film formed on a surface of the semiconductor substrate, an interlayer insulating film formed on the gate insulating film, a surface electrode including a plurality of wiring lines having a damascene structure selectively embedded in the interlayer insulating film with a predetermined pattern and a between-wiring-lines insulating film disposed between the wiring lines adjoining each other by use of a part of the interlayer insulating film, a through electrode penetrating the semiconductor substrate and electrically connected to the surface electrode, and a via insulating film disposed between the through electrode and the semiconductor substrate (claim 1).

This semiconductor device can be manufactured, for example, according to a semiconductor-device manufacturing method of the present invention (claim 13) that includes a step of forming a gate insulating film on a surface of a semiconductor substrate; a step of selectively forming an electrode layer having a predetermined pattern on the gate insulating film; a step of forming an interlayer insulating film on the gate insulating film so as to cover the electrode layer; a step of forming a surface electrode by selectively embedding an electrode material having a same pattern as the electrode layer in the interlayer insulating film according to a damascene method so as to include a plurality of wiring lines having a same pattern as the electrode layer and a between-wiring-lines insulating film that is formed between the wiring lines adjoining each other by use of a part of the interlayer insulating film and that has an opposite pattern of the pattern of the electrode layer; a step of forming a through hole by removing the semiconductor substrate and the electrode layer while performing etching from a reverse surface of the semiconductor substrate, and, simultaneously, exposing the interlayer insulating film provided with a projecting portion having a same pattern as the between-wiring-lines insulating film in the through hole; a step of etching the interlayer insulating film so that a part of the projecting portion remains as an etching residue until the wiring line of the surface electrode is exposed through the through hole; a step of forming a via insulating film at a bottom surface and a side surface of the through hole; a step of etching the via insulating film of the bottom surface of the through hole until the wiring line of the surface electrode is exposed; and a step of forming a through electrode so as to be electrically connected to the surface electrode by plating an electrode material on the inner side of the via insulating film on the through hole.

This semiconductor device can also be manufactured according to a semiconductor-device manufacturing method of the present invention (claim 16) that includes a step of selectively embedding an insulating layer having a predetermined pattern into a surface of the semiconductor substrate; a step of forming a gate insulating film on the surface of the semiconductor substrate; a step of forming an interlayer insulating film on the gate insulating film; a step of forming a surface electrode by selectively embedding an electrode material having an opposite pattern of the pattern of the insulating layer in the interlayer insulating film according to a damascene method so as to include a plurality of wiring lines having an opposite pattern of the pattern of the insulating layer and a between-wiring-lines insulating film that is formed between the wiring lines adjoining each other by use of a part of the interlayer insulating film and that has a same pattern as the insulating layer; a step of forming a through hole by removing the semiconductor substrate while performing etching from a reverse surface of the semiconductor substrate, and, simultaneously, exposing the insulating layer having a same pattern as the betweenwiring-lines insulating film in the through hole; a step of etching the interlayer insulating film so that a part directly under the insulating layer in the interlayer insulating film remains as an etching residue until the wiring line of the surface electrode is exposed through the through hole; a step of forming a via insulating film at a bottom surface and aside surface of the through hole; a step of etching the via insulating film of the bottom surface of the through hole until the wiring line of the surface electrode is exposed; and a step of forming a through electrode so as to be electrically connected to the surface electrode by plating an electrode material on the inner side of the via insulating film on the through hole.

According to the method of the present invention, an electrode layer having an opposite pattern of the pattern of the between-wiring-lines insulating film of the surface electrode or an insulating layer having the same pattern as the between-wiring-lines insulating film of the surface electrode is formed beforehand. As a result, when a through hole is formed by etching the semiconductor substrate from the reverse surface toward the surface electrode, a part of the projecting portion of the interlayer insulating film or apart directly under the insulating layer in the interlayer insulating film can be left as an etching residue on the between-wiring-lines insulating film.

Therefore, when a via insulating film is formed, the via insulating film is leveled up by the height of the etching residue with the same pattern as the between-wiring-lines insulating film at the position directly on the etching residue (at the position directly on the between-wiring-lines insulating film). In other words, in the via insulating film, a level difference is generated between a part at which the etching residue is present and a part at which the etching residue is absent.

At the etching step of the via insulating film, the part that has been leveled up becomes an etching margin having the same pattern as the between-wiring-lines insulating film with respect to the part that has not been leveled up. Therefore, even if the via insulating film is etched until the wiring line of the surface electrode is exposed, it is possible to completely eliminate or reduce the amount of etching of the between-wiring-lines insulating film brought by this etching operation.

As a result, a level difference can be prevented from occurring between the wiring lines of the surface electrode. Therefore, when an electrode material is plated, a seed film can be formed on the inner surface of the through hole with excellent coating ability, and therefore the occurrence of voids can be prevented.

As a result, in the semiconductor device of the present invention, it is possible to realize a semiconductor device that is capable of preventing the occurrence of voids in a through electrode and that has higher reliability in comparison to conventional semiconductor devices.

In the semiconductor device of the present invention, for example, by forming a through hole having a diameter smaller than the diameter of the surface electrode at the step of forming the through hole, the surface electrode may further include a facing portion facing the through electrode, a projecting portion projecting in a lateral direction from the facing portion, and an electrode layer disposed between the gate insulating film and the interlayer insulating film and having a same pattern as the wiring line of the projecting portion (claim 2), or the surface electrode may further include an insulating layer embedded in the surface of the semiconductor substrate and having a same pattern as the between-wiring-lines insulating film of the projecting portion (claim 3).

Preferably, the step of forming the electrode layer is executed at a same step as a gate electrode of a semiconductor device formed on the surface of the semiconductor substrate (claim 14), and, preferably, the step of forming the electrode layer includes a step of forming a polysilicon layer if the semiconductor substrate is a silicon substrate (claim 15).

According to this method, it is possible to efficiently form an electrode layer without increasing the number of steps.

Preferably, the step of forming the insulating layer includes a step of forming a shallow trench having the predetermined pattern by etching the semiconductor substrate from the surface and a step of forming the insulating layer so as to embed the insulating layer in the surface of the semiconductor substrate on a side of the reverse surface by filling the shallow trench with an insulation material (claim 17).

According to this method, when a plurality of element isolation regions are formed in a semiconductor substrate, for example, by an STI (Shallow Trench Isolation) step, an insulating layer can be formed at the same step as the STI step, and therefore the insulating layer can be efficiently formed.

Preferably, in the semiconductor device of the present invention, the wiring line and the between-wiring-lines insulating film are formed to be flush with each other in a connection surface with the through electrode in the surface electrode (claim 4).

According to this arrangement, the coating ability of the seed film with respect to the bottom surface of the through hole can be further improved.

In the semiconductor device of the present invention, the wiring line and the between-wiring-lines insulating film may be alternately arranged in a stripe manner in the surface electrode (claim 5).

Additionally, the wiring line may include a Cu wiring line (claim 6). Additionally, the surface electrode may include multi-layer electrodes between which the interlayer insulating films are interposed are stacked together (claim 7).

Additionally, the semiconductor device of the present invention may include a surface bump for external connection disposed at a position directly on the through electrode so that the surface electrode is placed between the surface bump and the through electrodes (claim 8), and the semiconductor device may include a reverse bump for external connection disposed at an end on a reverse surface side of the through electrode (claim 9).

Additionally, the through electrode may be formed in a cylindrical shape (claim 10).

Additionally, the surface of the semiconductor substrate may include a device-forming surface on which a plurality of semiconductor devices are formed (claim 11).

The electronic component of the present invention includes an interposer having a plurality of outside terminals on a reverse surface thereof, the semiconductor device of any one of claim 1 to claim 11 laid on a surface of the interposer in a posture in which the surface thereof is directed upwardly, a second semiconductor device having a plurality of reverse bumps and laid on the surface of the semiconductor device so that the reverse bump is electrically connected to the through electrode, and a resin package sealing the semiconductor device and the second semiconductor device (claim 12).

According to this arrangement, the semiconductor device of the present invention is mounted, and therefore an electronic component having higher reliability in comparison to conventional semiconductor devices can be realized.

BRIEF DESCRIPTION OF DRAWINGS

FIG. 5 is a view showing an example of the shape of a lower insulating film of FIG. 4, enlarging a part surrounded by the broken line V of FIG. 4.

FIG. 6 is a layout chart of surface pads (lower pads) of FIG. 4.

FIG. 7O is a view showing a step subsequent to the step of FIG. 7N.

FIG. 8 is a schematic sectional view to describe a structure of the arithmetic chip of FIG. 1 (second embodiment), enlarging a part at which a through electrode is disposed.

DESCRIPTION OF EMBODIMENTS

Embodiments of the present invention will be hereinafter described in detail with reference to the accompanying drawings.

Figure 1:
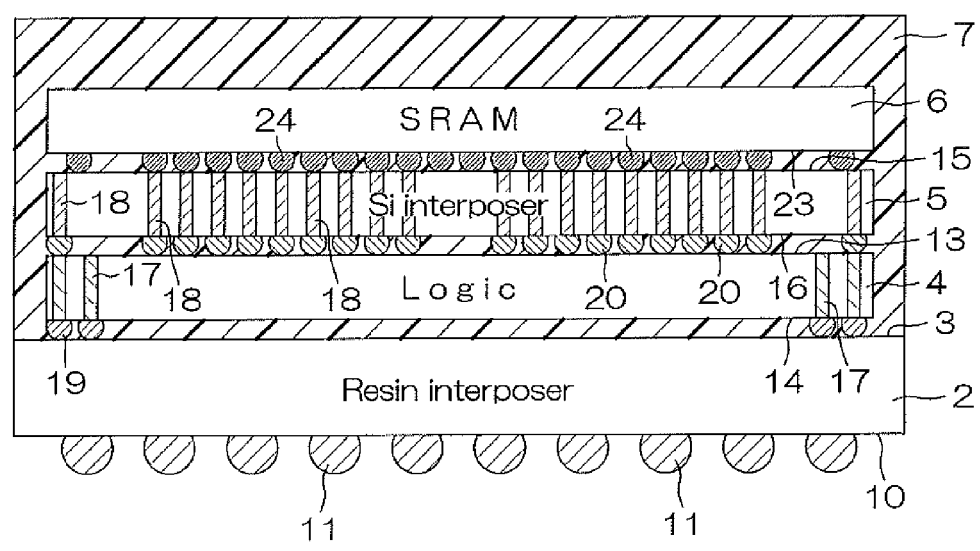
FIG. 1 is a schematic sectional view of an electronic component according to an embodiment of the present invention.
Figure 2:
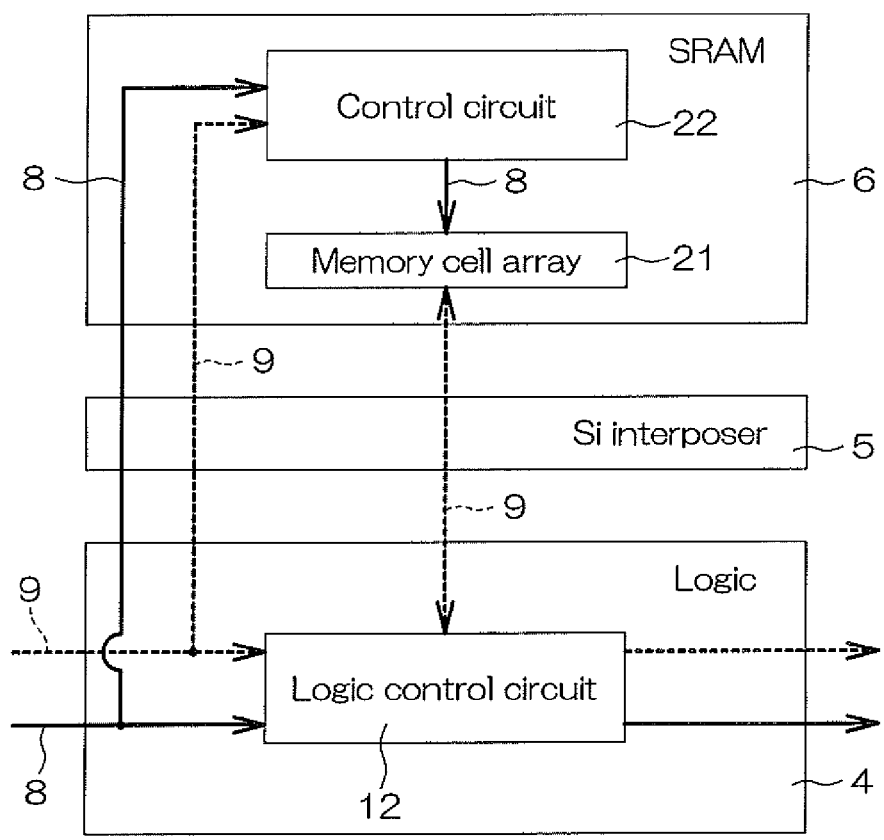
FIG. 2 is a block diagram that schematically shows a system configuration of the electronic component of FIG. 1.

FIG. 1 is a schematic sectional view of an electronic component 1 according to an embodiment of the present invention. FIG. 2 is a block diagram that schematically shows a system configuration of the electronic component 1 of FIG. 1.

The electronic component 1 includes a resin interposer 2, an arithmetic chip 4, an Si interposer 5, and a memory chip 6 that are stacked together in order from a surface 3 of the resin interposer 2, and a resin package 7, and has power-supply wiring lines 8 and signal-system wiring lines 9 built therein. It should be noted that the arithmetic chip 4, the Si interposer 5, and the memory chip 6 are one example of a plurality of semiconductor devices stacked together on the surface 3 of the resin interposer 2, and the present invention is not limited to this.

The resin interposer 2 is made of a resinous (e.g., epoxy resin) substrate, and the arithmetic chip 4 etc., are stacked together on the surface 3 thereof, whereas a plurality of outside terminals 11 are formed on a reverse surface 10 thereof. The resin interposer 2 is 14 mm square in size, and may be, for example, from 10 mm square to 15 mm square. The resin interposer 2 is 0.7 mm in thickness, and may be, for example, from 0.6 mm to 0.7 mm in thickness.

The outside terminal 11 is for an electric connection with lands (electrodes) on a mounting substrate (printed-circuit board). Each outside terminal 11 is shaped like a ball made of a metallic material, such as solder, and is arranged, for example, in a matrix manner with an interval between each other. Each outside terminal 11 is electrically connected to a reverse bump 19 (described later) of the arithmetic chip 4 through an electrically-conductive via (not shown) that penetrates between the surface 3 and the reverse surface 10 of the resin interposer 2.

In the present embodiment, the arithmetic chip 4, the Si interposer 5, and the memory chip 6 are formed to be equal in size to each other, and are properly stacked together so that their side surfaces are aligned with each other. These chips are 10 mm square in size, and may be, for example, from 6 mm square to 10 mm square. These chips are smaller than the resin interposer 2, and are 0.05 mm in thickness, and may be, for example, from 0.04 mm to 0.06 mm in thickness.

As shown in FIG. 2, a logic control circuit 12 is built into the arithmetic chip 4 serving as a semiconductor device disposed between the resin interposer 2 and the uppermost memory chip 6 serving as a second semiconductor device among those semiconductor chips 4 to 6. The power-supply wiring line 8 and the signal-system wiring line 9 of the electronic component 1 are connected to the logic control circuit 12. The arithmetic chip 4 has its surface 13 on which a plurality of semiconductor devices composing the logic control circuit 12, such as a transistor (e.g., CMOS transistor), a diode, a resistor, and a capacitor, are formed. In other words, in the arithmetic chip 4, the surface 13 facing the memory chip 6 is a device-forming surface, and the arithmetic chip 4 is stacked on the resin interposer 2 in a posture in which the device-forming surface 13 is directed upwardly.

Additionally, the arithmetic chip 4 and the Si interposer 5 serving as a semiconductor device have a plurality of through electrodes 17 and 18 formed so as to penetrate between the surfaces 13, 15 and the reverse surfaces 14, 16, respectively, and reverse bumps 19 and 20 are disposed at ends on their reverse surface sides (14 and 16) of the through electrodes 17 and 18, respectively, one by one. Each of the reverse bumps 19 and 20 is shaped like a ball by use of a metallic material such as solder. The reverse bump 19 of the arithmetic chip 4 is electrically connected to the semiconductor device on the surface 13.

On the other hand, a memory cell array 21 (in the present embodiment, SRAM (Static Random Access Memory) cell array) and a control circuit 22 are built into the uppermost memory chip 6, and the power-supply wiring line 8 and the signal-system wiring line 9 of the electronic component 1 are connected to these circuits 21 and 22. More specifically, the control circuit 22 is connected to the memory cell array 21 by means of the power-supply wiring line 8, and the memory cell array 21 is connected to the logic control circuit 12 of the arithmetic chip 4 by means of the signal-system wiring line 9. The memory chip 6 has its reverse surface 23 on which a plurality of semiconductor devices, such as transistors, diodes, resistors, and capacitors, that compose the memory cell array 21 and the control circuit 22 are formed. In other words, in the memory chip 6, the reverse surface 23 facing the arithmetic chip 4 is a device-forming surface, and the memory chip 6 is stacked on the resin interposer 2 in a posture in which the device-forming surface 23 is directed downwardly. Additionally, in the memory chip 6, a plurality of reverse bumps 24 are disposed on the reverse surface 23. Each reverse bump 24 is shaped like a ball by use of a metallic material such as solder. The reverse bump 24 is electrically connected to the semiconductor device on the reverse surface 23.

The reverse bumps 24 of the memory chip 6 are relayed by the through electrodes 18 of the Si interposer 5 and by the reverse bumps 20, and are electrically connected to the through electrodes 17 of the arithmetic chip 4 and to the reverse bumps 19, which differ in pitch. As a result, the semiconductor chips stacked together are electrically connected together, and are electrically connected to the outside terminals 11 of the resin interposer 2.

In the present embodiment, although the arithmetic chip 4 and the memory chip 6 differ in terminal pitch from each other, and therefore the Si interposer 5 serving as an electric relay is interposed between these chips, the Si interposer 5 may be excluded if these chips are exactly equal in terminal pitch to each other.

The resin package 7 (e.g., epoxy resin) seals only the surface side (3) of the resin interposer 2 so as to expose the reverse surface 10 of the resin interposer 2, and covers the whole of the arithmetic chip 4, the Si interposer 5, and the memory chip 6 so as not to expose these chips. Additionally, the resin package 7 is formed such that its side surface becomes flush with the side surface of the resin interposer 2.

Figure 3:
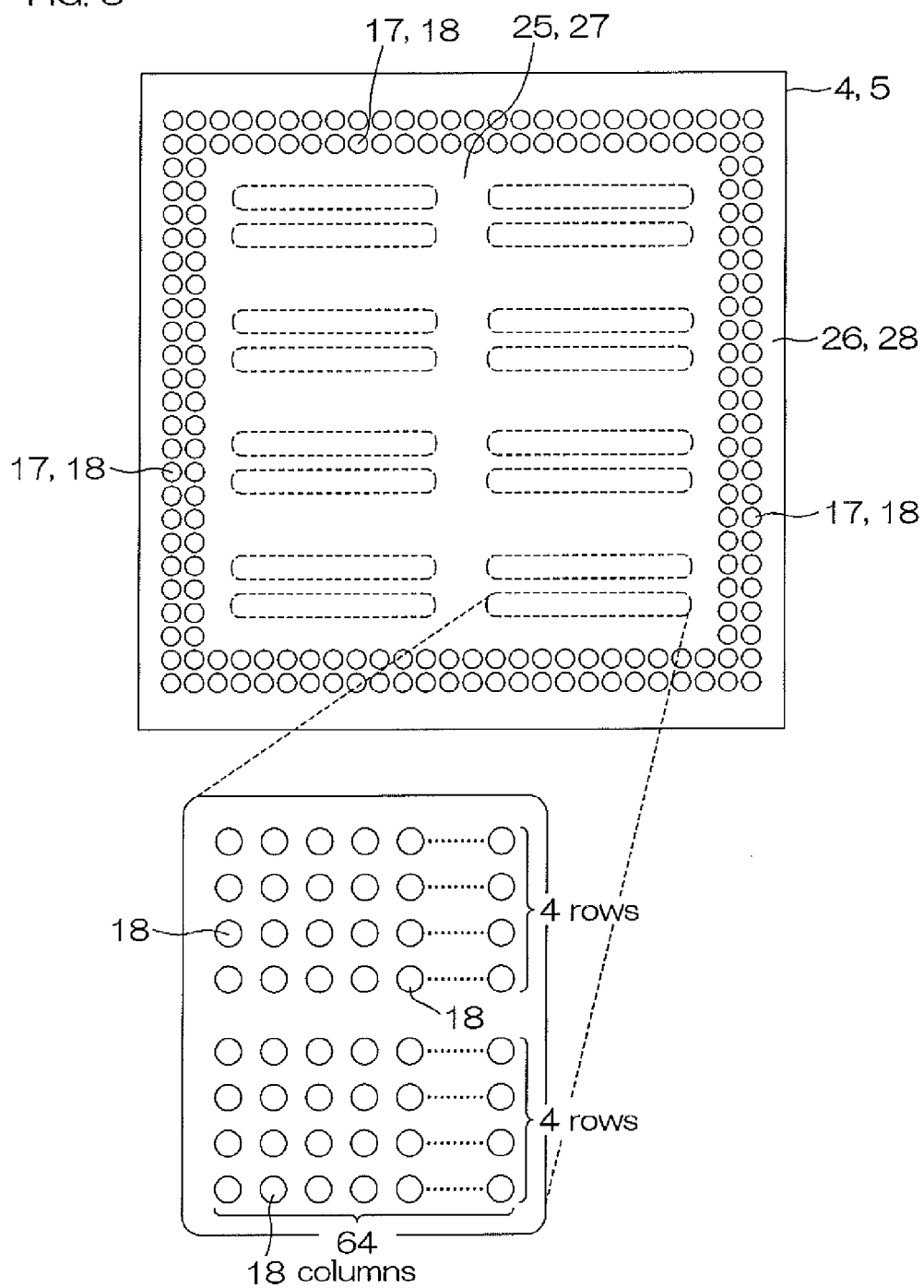
FIG. 3 is a layout chart of through electrodes in an Si interposer and in an arithmetic chip of FIG. 1.

FIG. 3 is a layout chart of the through electrodes 17 and 18 in the Si interposer 5 and the arithmetic chip 4 of FIG. 1.

In the present embodiment, the arithmetic chip 4 and the Si interposer 5 among the semiconductor chips 4 to 6 stacked together have the through electrodes 17 and 18, respectively, as shown in FIG. 1.

In the arithmetic chip 4, for example, the through electrodes 17 arranged in a plurality of columns (in the present embodiment, in two columns) are annularly disposed along a peripheral edge 26 that surrounds a central part 25 of the arithmetic chip 4. For example, the through electrodes 17 of the arithmetic chip 4 may be arranged irregularly and at random, and may be annularly disposed along the peripheral edge 26 of the arithmetic chip 4 as a whole.

This makes it possible for the arithmetic chip 4 to send electric power and electric signals to the memory chip 6 by using the through electrodes 17. In other words, the through electrodes 17 of the arithmetic chip 4 form the power-supply wiring line 8 and the signal-system wiring line 9 of the electronic component 1, and electric power and signals are sent by these wiring lines 8 and 9.

On the other hand, in the Si interposer 5, for example, a single column of through electrodes 18 are annularly disposed along a peripheral edge 28 surrounding a central part 27 of the Si interposer 5 (hereinafter, these through electrodes 18 are referred to as through electrodes 18 of the peripheral edge 28 when necessary), and a plurality of groups each of which consists of a plurality of through electrodes 18 are disposed at the central part 27 surrounded by the peripheral edge 28 in a matrix manner (hereinafter, these through electrodes 18 are referred to as through electrodes 18 of the central part 27 when necessary).

In the present embodiment, each through electrode 18 of the peripheral edge 28 is disposed directly above each through electrode 17 of the arithmetic chip 4 so as to be placed on the same straight line as each through electrode 17 of the arithmetic chip 4.

In each group of the through electrodes 18 of the central part 27, a plurality of blocks each of which consists of a plurality of through electrodes 18 arranged in a matrix manner are provided. More specifically, in the present embodiment, eight groups are arranged in a two-row-and-four-column (2×4) matrix manner, and, in each group, two blocks each of which consists of four-row-and-sixty-four-column (4×64) through electrodes 18 are provided, i.e., five hundred and twelve through electrodes 18 in total are provided for one group. These groups are eight in number, and therefore 4096 (512 pieces×8 groups) through electrodes 18 are provided in the whole of the Si interposer 5.

As a result, the Si interposer 5 can relay an electric signal having a number of bits (in the present embodiment, 4096 bits) corresponding to the number of the through electrodes 18 of the central part 27 between the arithmetic chip 4 (e.g., the logic control circuit 12) and the memory chip 6 (e.g., the memory cell array 21), for example, by using the through electrodes 18 of the central part 27. In other words, the through electrodes 18 of the central part 27 of the Si interposer 5 form the signal-system wiring line 9 of the electronic component 1, and an electric signal is bidirectionally transmitted and received by this wiring line 9. The arrangement or the number of the through electrodes 18 is merely one example of the present invention, and this can be appropriately changed according to the design of each electronic component 1. For example, 256 through electrodes 18 of one block may be arranged in an eight-row-and-thirty-two-column (8×32) matrix manner.

Additionally, the Si interposer 5 can relay electric power and an electric signal sent from the arithmetic chip 4 to the memory chip 6 (e.g., the control circuit 22), for example, by using the through electrodes 18 of the peripheral edge 28. In other words, the through electrodes 18 of the peripheral edge 28 of the Si interposer 5 form the power-supply wiring line 8 and the signal-system wiring line 9 of the electronic component 1, and electric power and an electric signal are sent by these wiring lines 8 and 9.

Figure 4:
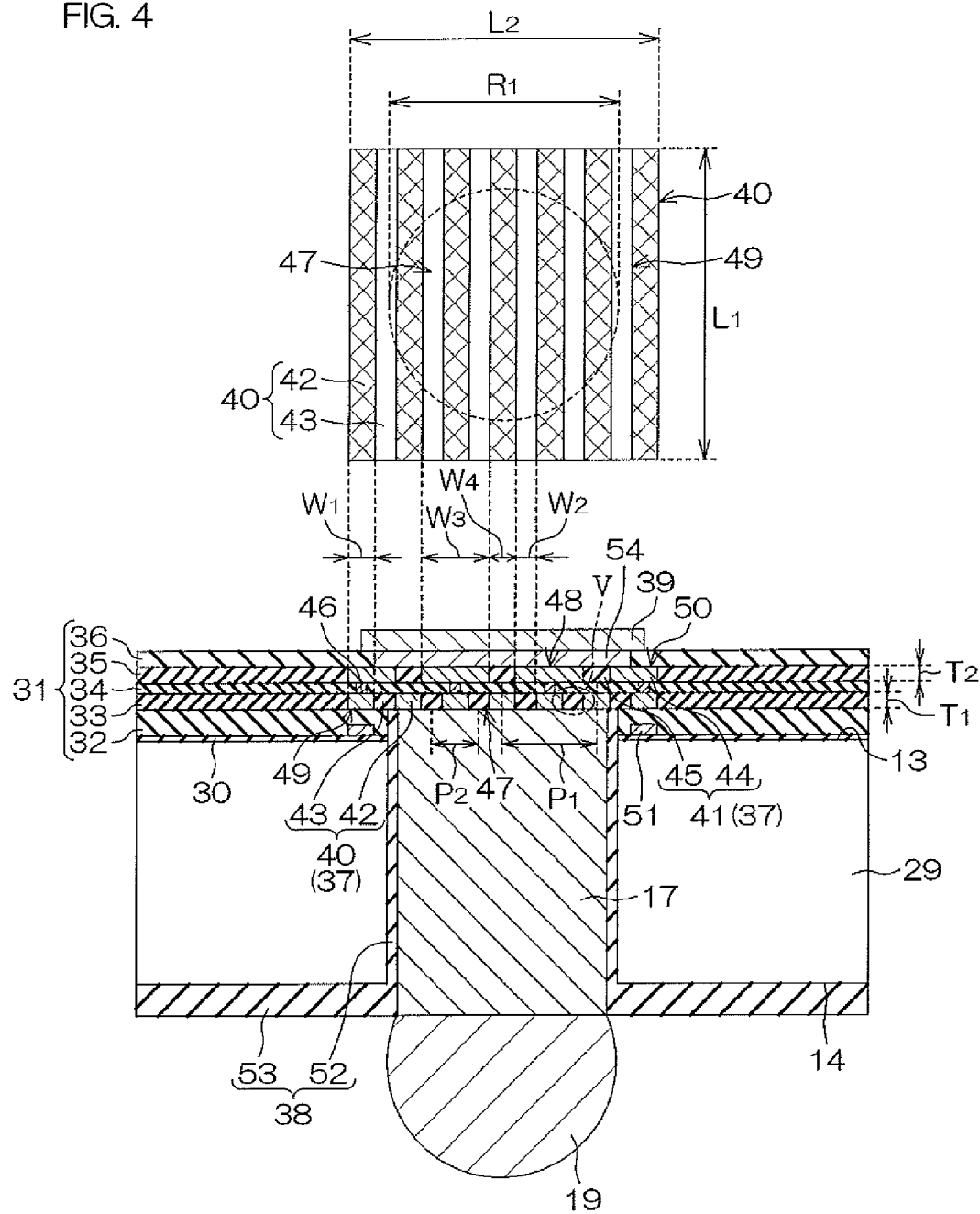
FIG. 4 is a schematic sectional view to describe a structure of the arithmetic chip of FIG. 1 (first embodiment), enlarging a part at which a through electrode is disposed.

FIG. 4 is a schematic sectional view to describe a structure (first embodiment) of the arithmetic chip 4 of FIG. 1, enlarging a part at which a through electrode 17 is disposed. FIG. 5 is a view showing an example of the shape of the lower insulating film 43 of FIG. 4, enlarging a part surrounded by the broken line V of FIG. 4. FIG. 6 is a layout chart of the surface pads 37 (lower pads) of FIG. 4.

The arithmetic chip 4 includes an Si substrate 29 serving as a semiconductor substrate that forms the main body of the arithmetic chip 4, a gate insulating film 30, an interlayer insulating film 31 (first to fifth interlayer insulating films 32 to 36), surface pads 37 serving as surface electrodes, through electrodes 17, a via insulating film 38, surface bumps 39, and reverse bumps 19.

The Si substrate 29 is a substrate whose thickness is, for example, 30 μm to 50 μm, and has a surface (device-forming surface) 13 on which the gate insulating film 30 and a plurality of (in the present embodiment, five) interlayer insulating films 31 are stacked together in this order. The gate insulating film 30 is a film formed integrally with a gate insulating film of a transistor (not shown) formed on this surface 13, and is shared with this transistor.

The surface pad 37 is formed in a quadrangular shape, and, in the present embodiment, has a multi-layer pad structure in which it is embedded in a plurality of interlayer insulating films.

More specifically, the surface pad 37 is formed in a square shape in which $L_1 \times L_2$ representing its height and its width is 25.7 μm×25.7 μm in size (when the design rule is 90 nm), and has a two-layer pad structure in which the surface pad 37 is embedded in a second interlayer insulating film 33 and in a fourth interlayer insulating film 35 with a third interlayer insulating film 34 disposed vertically between the second film 33 and the fourth film 35. The surface pad 37 includes a lower pad 40 embedded in the second interlayer insulating film 33 and an upper pad 41 embedded in the fourth interlayer insulating film 35. The surface pad 37 may be rectangular or circular.

The lower pad 40 includes a lower wiring line 42 that is made of copper (Cu) and that has a damascene structure selectively embedded in the second interlayer insulating film 33 with a stripe pattern and a stripe-like lower insulating film 43 (between-wiring-lines insulating film) disposed between lower wiring lines 42 adjoining each other by use of a part of the second interlayer insulating film 33.

As a result, the lower wiring line 42 and the lower insulating film 43 are alternately arranged in a stripe manner in the lower pad 40. The width $W_1$ of the lower wiring line 42 is about 1 μm, and the width $W_2$ of the lower insulating film 43 is about 0.3 μm, and the thickness $T_1$ of the lower pad 40 is about 0.3 μm. Regarding the width $W_1$ and the width $W_2$, no specific limitations are imposed if these widths fall within a range in which dishing does not occur in the lower wiring line 42 when the lower wiring line 42 is embedded in the first interlayer insulating film 32 according to the damascene method.

Additionally, in the lower pad 40, the lower insulating film 43 may be formed to become flush with the lower wiring line 42 in a connection surface with the through electrode 17 as shown in FIG. 5(a), or may be formed to swell toward the through electrode 17 with respect to the lower wiring line 42 as shown in FIG. 5(b). Alternatively, the lower insulating film 43 may be formed to hollow toward the side opposite to the through electrode 17 with respect to the lower wiring line 42 as shown in FIG. 5(c).

As shown in FIG. 6, the lower pad 40 may be arranged so that the stripes regularly follow the same direction on the Si substrate 29 (right-hand column in the sheet of FIG. 6), or may be arranged so that the stripes are irregular indirection such that, for example, the lower pad 40 having vertical stripes and the lower pad 40 having horizontal stripes are disposed alternately (left-hand column in the sheet of FIG. 6).

Although the upper pad 41 includes an upper wiring line 44 that is made of copper (Cu) and that has a damascene structure selectively embedded in the fourth interlayer insulating film 35 with a stripe pattern and a stripe-like upper insulating film 45 (between-wiring-lines insulating film) disposed between upper wiring lines 44 adjoining each other by use of a part of the fourth interlayer insulating film 35 in the same way as the lower pad 40, the pitch $P_1$ of the upper insulating film 45 (distance between upper insulating films 45 adjoining each other) differs from the pitch $P_2$ of the lower insulating film 43.

In the present embodiment, the pitch $P_1$ of the upper insulating film 45 is made greater than the pitch $P_2$ of the lower insulating film 43, and the upper insulating film 45 is disposed directly on the lower wiring line 42 with the same width $W_4$ (=$W_1$) as the lower wiring line 42 at one-column intervals with respect to the lower wiring line 42. As a result, the width $W_3$ of the upper wiring line 44 is greater than the width $W_1$ of the lower wiring line 42, and is, for example, about 1.8 μm. The thickness $T_2$ of the upper pad 41 is about 0.3 μm (=$T_1$). Regarding the width $W_3$ and the width $W_4$, no specific limitations are imposed if these widths fall within a range in which dishing does not occur in the upper wiring line 44 when the upper wiring line 44 is embedded in the fourth interlayer insulating film 35 according to the damascene method.

The shape of the lower insulating film 43 shown in FIG. 5(a) to FIG. 5(c) can be applied to the shape of the upper insulating film 45, and the layout of the lower pad 40 shown in FIG. 6 can be applied to the layout of the upper pad 41.

An electric connection is made between the lower wiring line 42 of the lower pad 40 and the upper wiring line 44 of the upper pad 41 that vertically lie on each other through a plurality of electroconductive vias 46 (e.g., tungsten (W)) that penetrate the third interlayer insulating film 34.

The layered structure of the surface pad 37 is not limited to the two-layer structure, and may be, for example, a three-layer structure, a four-layer structure, a five- or more-layer structure. The wiring material of the surface pad 37 may be metallic materials other than Cu if it is a material capable of forming a damascene structure.

The through electrode 17 is made of copper (Cu), and is formed in a cylindrical shape so as to reach the surface pad 37 (lower pad 40) from the reverse surface 14 of the Si substrate 29 through the Si substrate 29, the gate insulating film 30, and the first interlayer insulating film 32 perpendicularly with respect to the reverse surface 14. As a result, the through electrode 17 and the surface pad 37 are arranged on the same straight line in the thickness direction of the Si substrate 29. The through electrode 17 and the surface pad 37 are not necessarily required to be arranged on the same straight line, and the surface pad 37 may be disposed apart from the through electrode 17 when viewed planarly, for example, by laying round a rewiring line or the like from an end on the side of the surface 13 of the Si substrate 29 of the through electrode 17.

The through electrode 17 has a smaller diameter $R_1$ than the vertical and horizontal lengths $L_1$ and $L_2$ of the surface pad 37, and is positioned inside the outer periphery of the surface pad 37 when viewed planarly from the side of the surface 13 of the Si substrate 29 as shown by the broken line of FIG. 4. In the present embodiment, the diameter $R_1$ is, for example, about 10 μm.

As a result, the surface pads 40 and 41 include facing portions 47 and 48 that face the through electrode 17 in a state of lying on each other when viewed planarly and each of which has the same planar shape as the through electrode 17 and projecting portions 49 and 50 that project from the facing portions 47 and 48 in a lateral direction (direction along the surface 13 of the Si substrate 29) and that surround the facing portions 47 and 48, respectively.

In the present embodiment, an electrode layer 51 having the same stripe pattern as the lower wiring line 42 of the projecting portion 49 of the lower pad 40 connected directly to the through electrode 17 in the multi-layer surface pads 37 is formed between the gate insulating film 30 and the interlayer insulating film 31 (first interlayer insulating film 32).

In the present embodiment, the electrode layer 51 is a layer formed in the same layer as a gate electrode (not shown) of a transistor (not shown) formed on the surface 13, and is made of polysilicon that is the same material as the Si substrate 29. When a substrate other than the Si substrate 29 is used, it is preferable to change the material of the electrode layer 51 so as to be the same as the material of the substrate other than the Si substrate 29 to be used.

The via insulating film 38 is made of silicon oxide ($SiO_2$), and is disposed between the through electrode 17 and the Si substrate 29 on the whole of the reverse surface 14 of the Si substrate 29.

In the present embodiment, the via insulating film 38 includes a main portion 52 with which a side surface (circumferential surface) of the through electrode 17 is covered and a reverse portion 53 with which the reverse surface 14 of the Si substrate 29 is covered. The main portion 52 of the via insulating film 38 and the reverse portion 53 of the via insulating film 38 are formed integrally with each other.

In the via insulating film 38, the main portion 52 is formed more thinly than the reverse portion 53. For example, the thickness of the main portion 52 is about 0.5 μm, and the thickness of the reverse portion 53 is about 1 μm.

The surface bumps 39 are disposed directly on the through electrodes 17 one by one so that the surface pad 37 is placed between the through electrodes 17 on the fifth interlayer insulating film 36. Each surface bump 39 is electrically connected to the upper pad 41 vertically lying on each other through an electroconductive via 54 (e.g., tungsten (W)) that penetrates the fourth interlayer insulating film 35. Each surface bump 39 is connected to, for example, the reverse bump 20 of the Si interposer 5 (see FIG. 1) in a state of laying the Si interposer 5 on the arithmetic chip 4.

As described above, the reverse bumps 19 are disposed one by one at the end on the side of the reverse surface 14 of each through electrode 17.

In the present embodiment, the arrangement of the arithmetic chip 4 described above is employed also in the Si interposer 5 that is a semiconductor substrate (Si substrate) having the through electrodes 18.

Figure 7A:
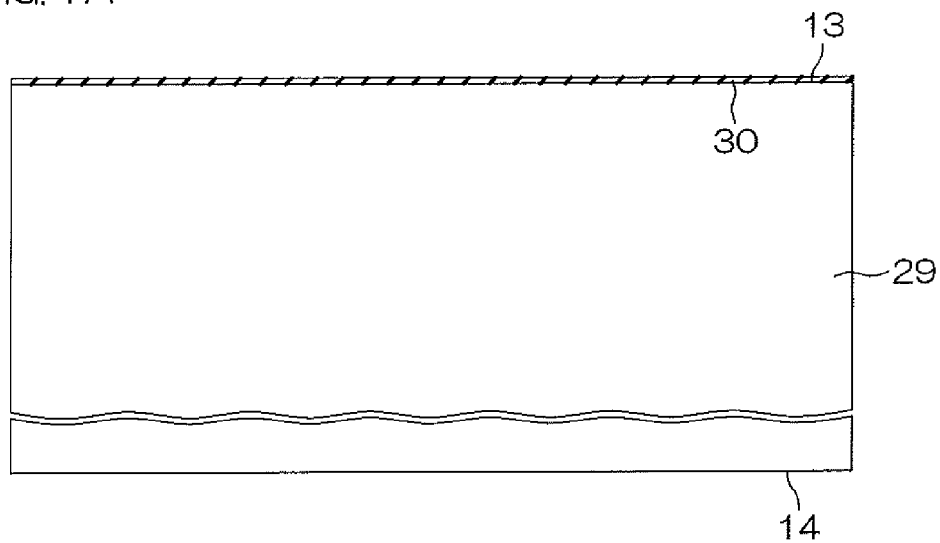
FIG. 7A is a view showing a part of a process for manufacturing the arithmetic chip of FIG. 4.
Figure 7B:
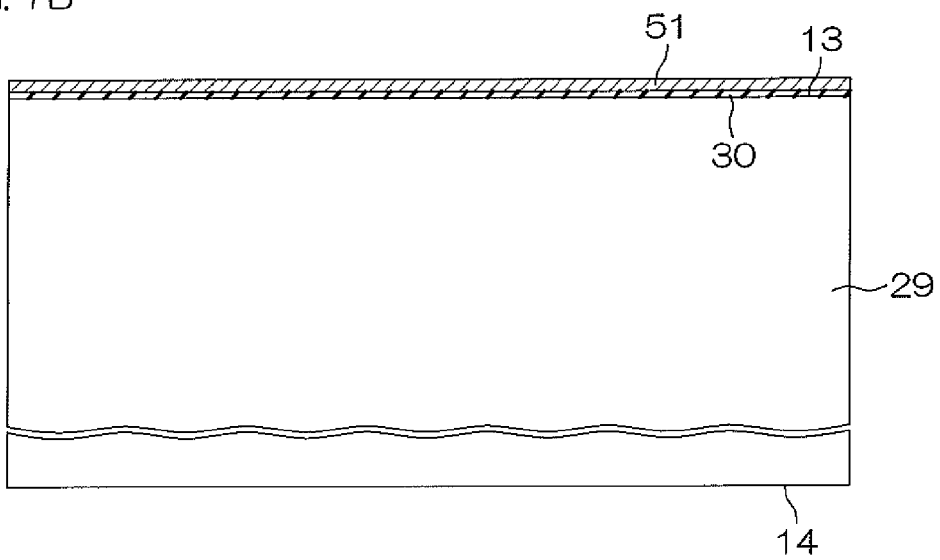
FIG. 7B is a view showing a step subsequent to the step of FIG. 7A.
Figure 7C:
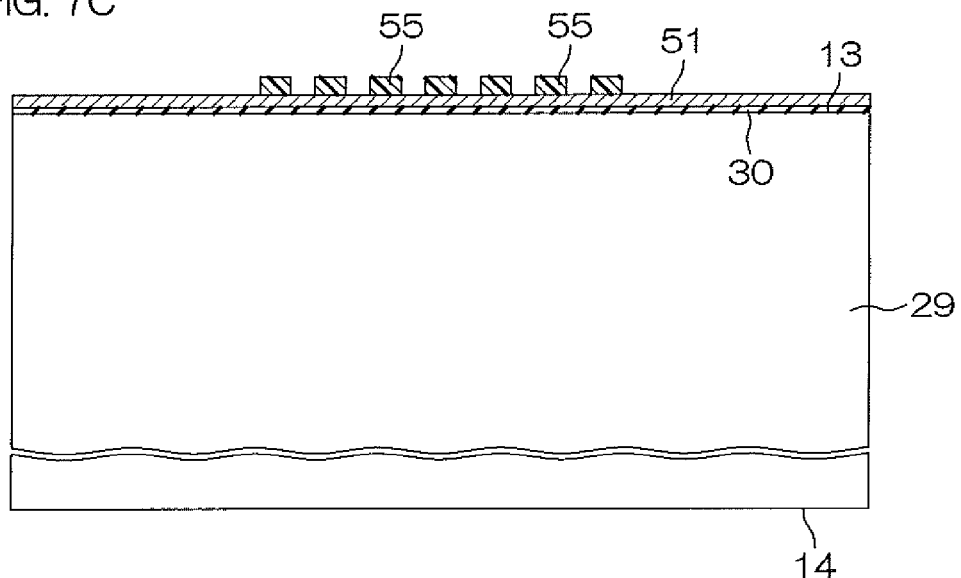
FIG. 7C is a view showing a step subsequent to the step of FIG. 7B.
Figure 7D:
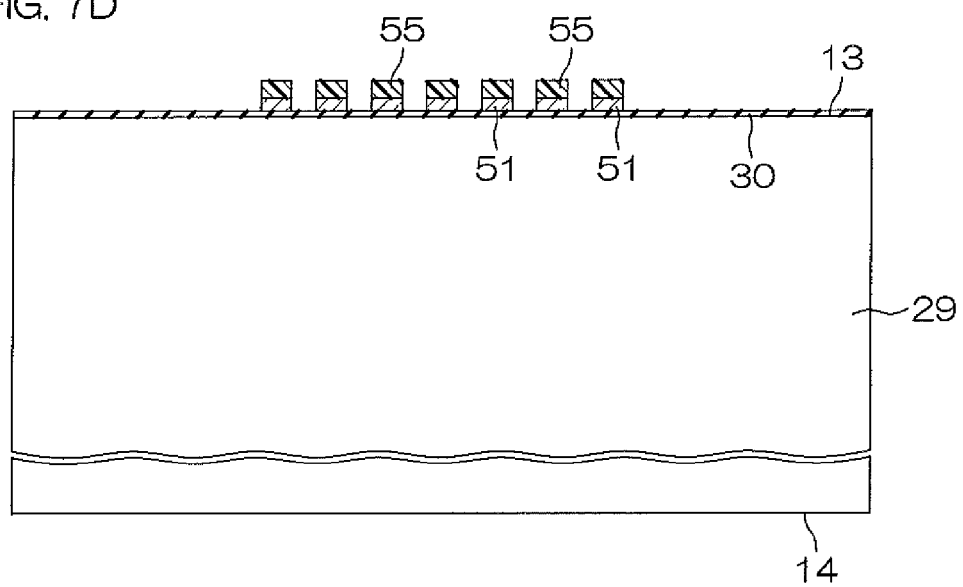
FIG. 7D is a view showing a step subsequent to the step of FIG. 7C.
Figure 7E:
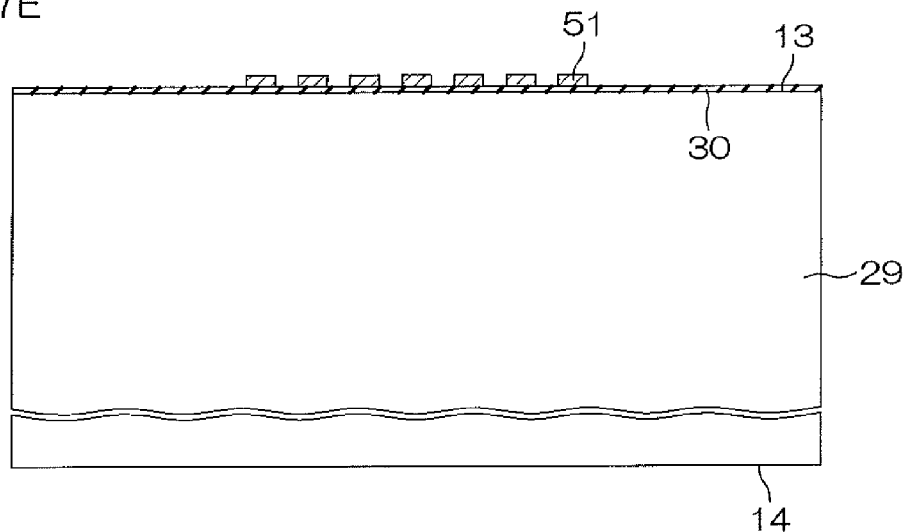
FIG. 7E is a view showing a step subsequent to the step of FIG. 7D.
Figure 7F:
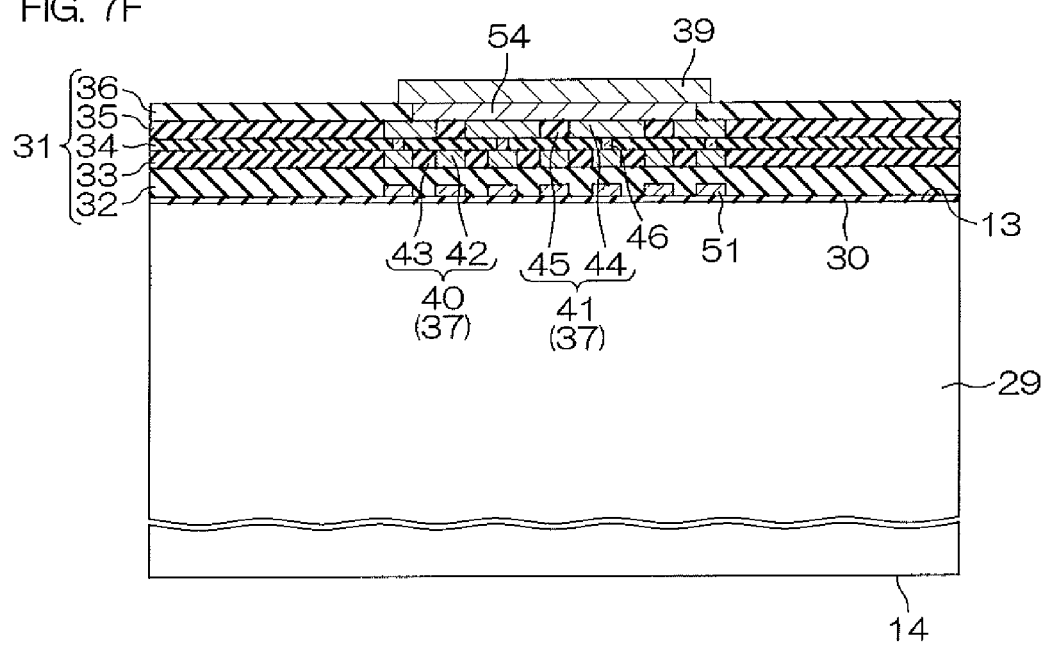
FIG. 7F is a view showing a step subsequent to the step of FIG. 7E.
Figure 7G:
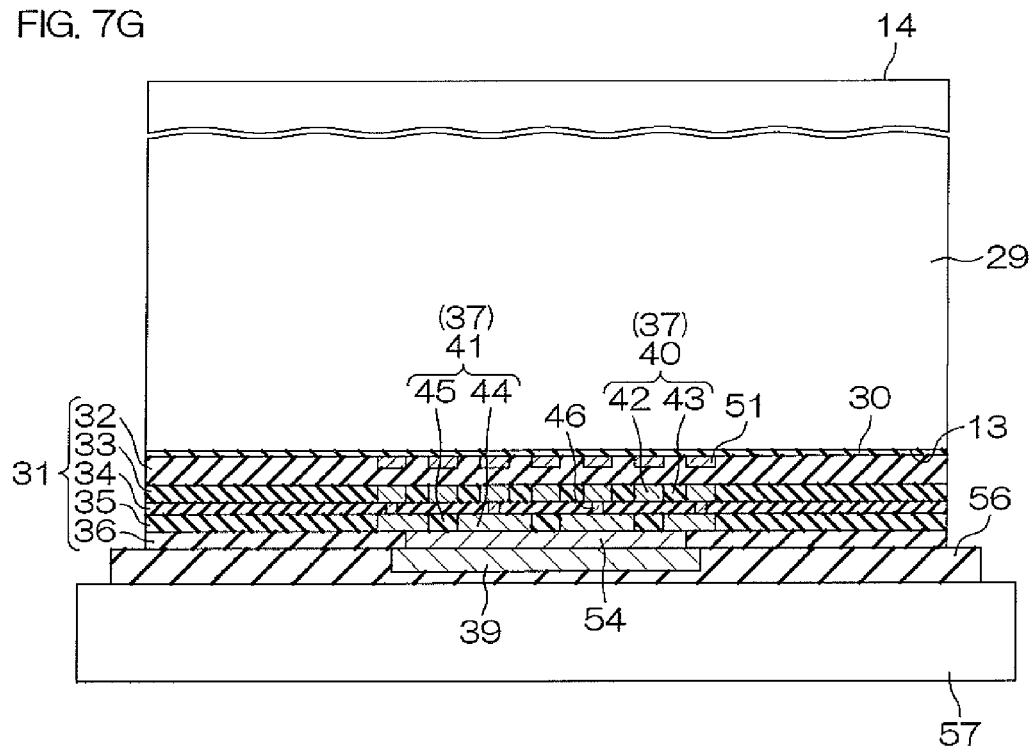
FIG. 7G is a view showing a step subsequent to the step of FIG. 7F.
Figure 7H:
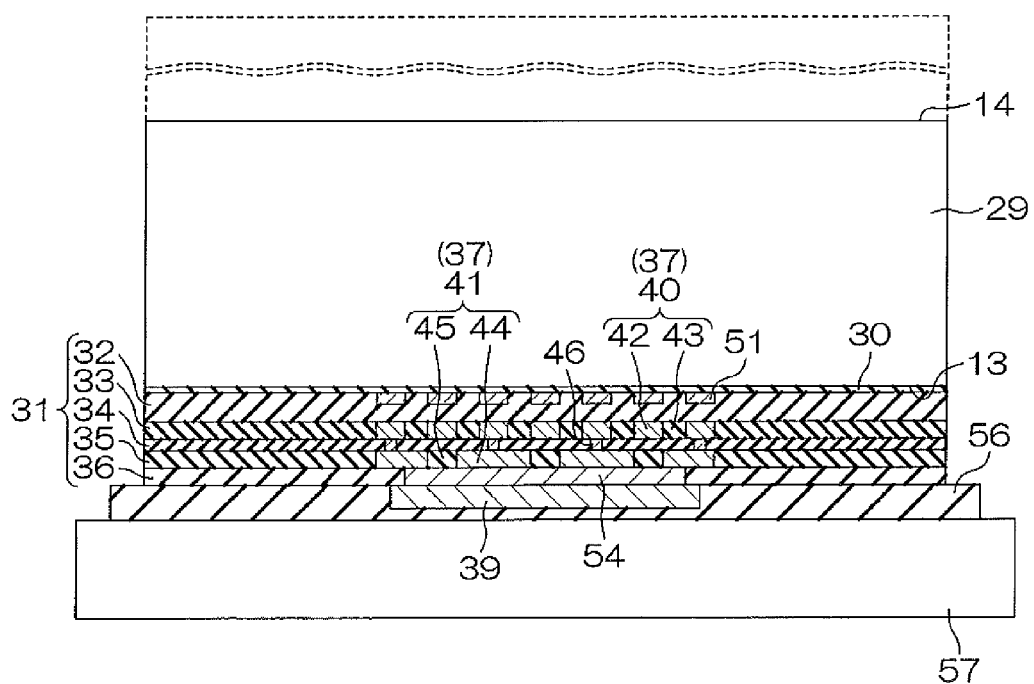
FIG. 7H is a view showing a step subsequent to the step of FIG. 7G.
Figure 7I:
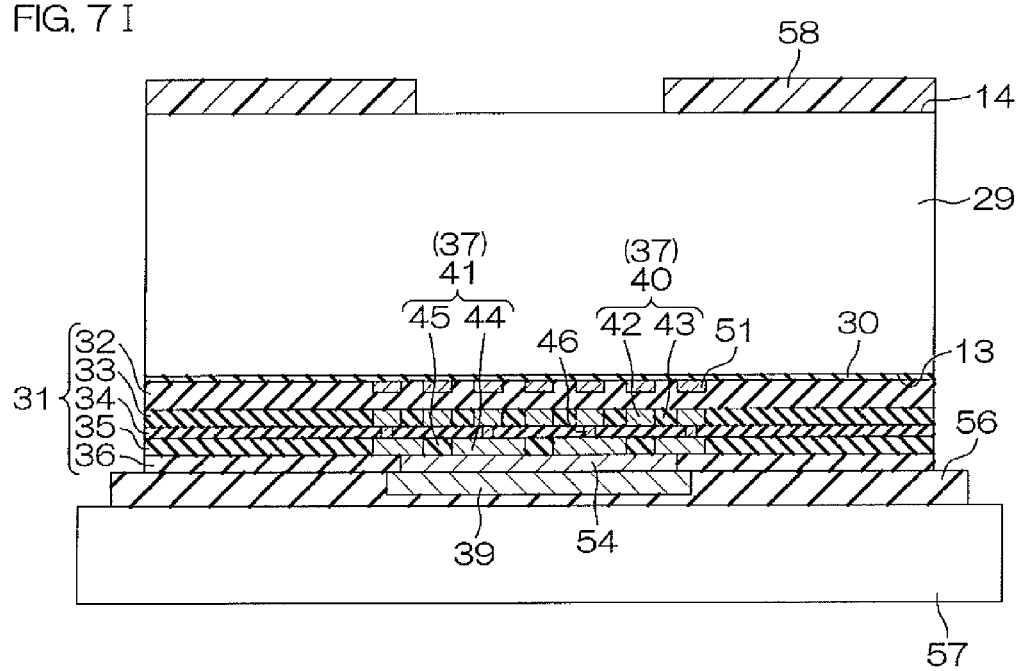
FIG. 7I is a view showing a step subsequent to the step of FIG. 7H.
Figure 7J:
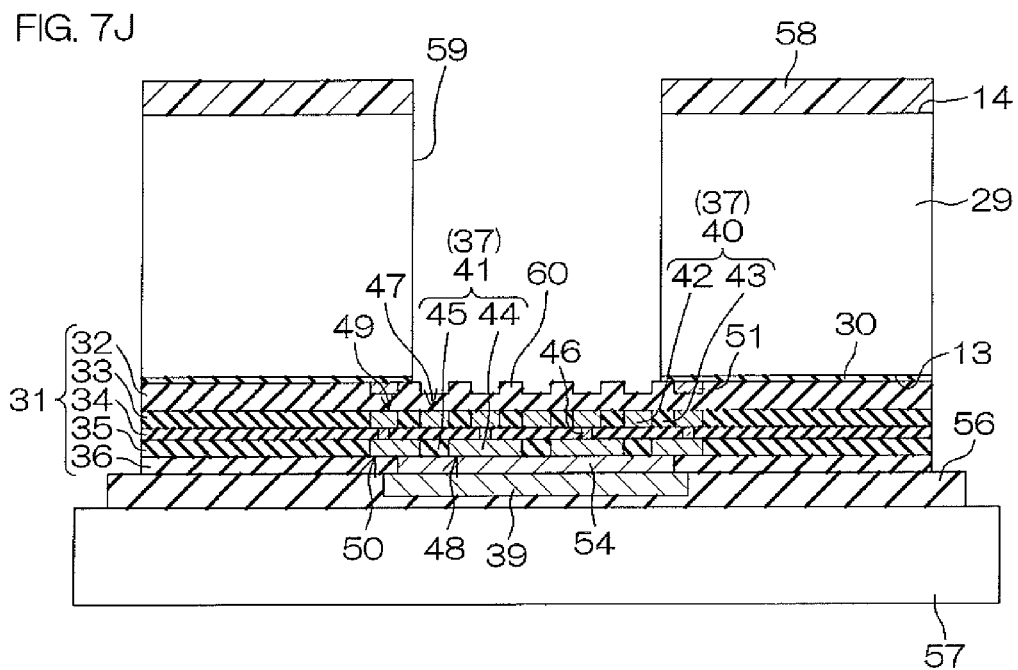
FIG. 7J is a view showing a step subsequent to the step of FIG. 7I.
Figure 7K:
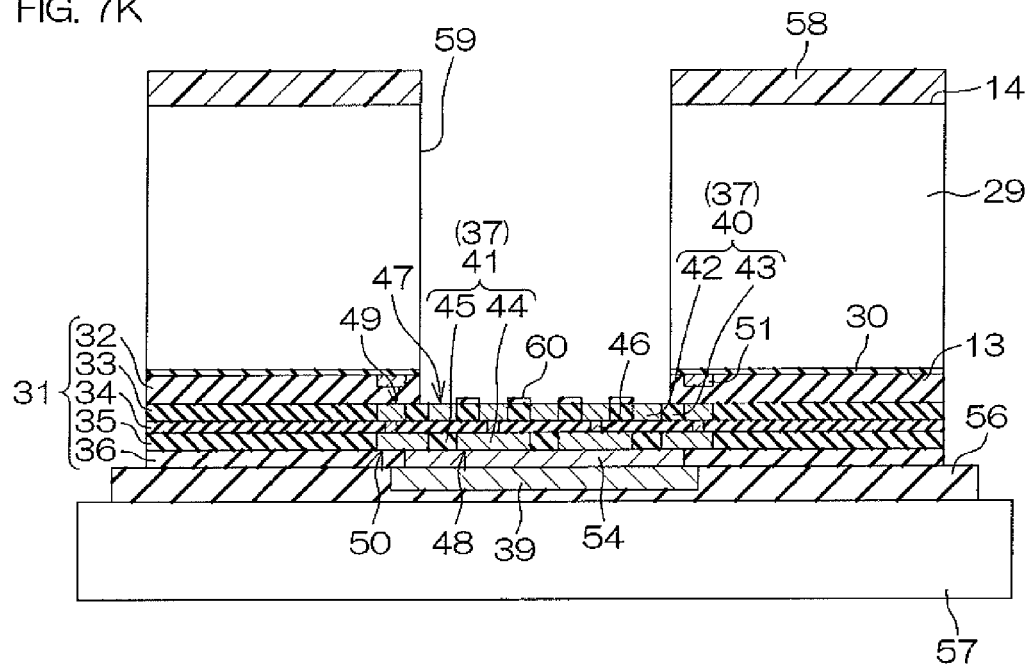
FIG. 7K is a view showing a step subsequent to the step of FIG. 7J.
Figure 7L:
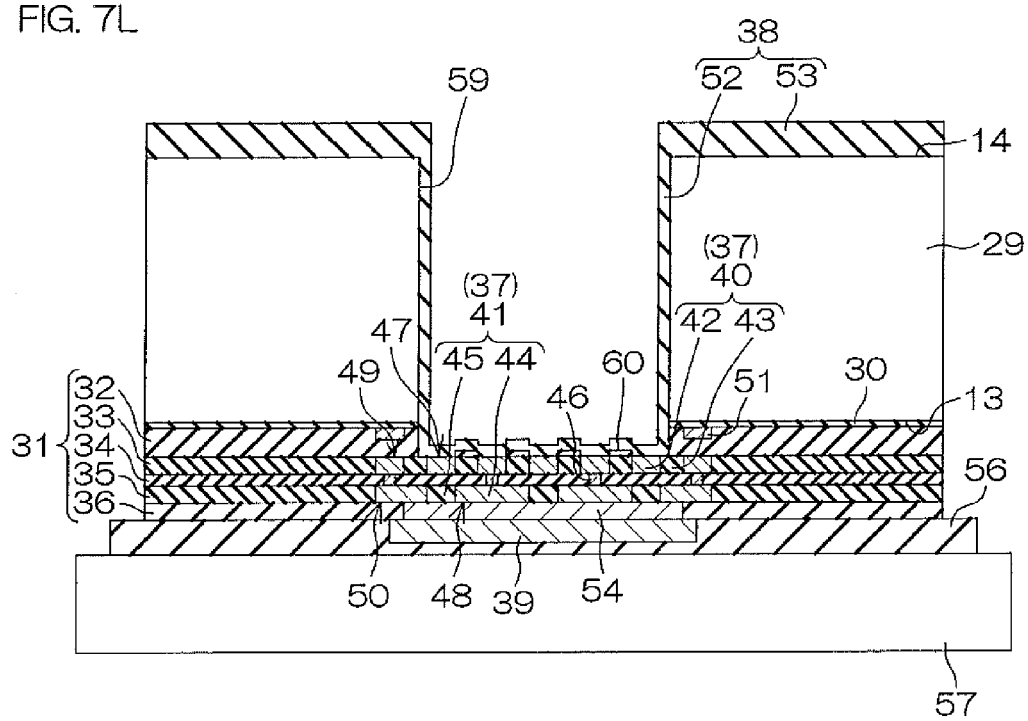
FIG. 7L is a view showing a step subsequent to the step of FIG. 7K.
Figure 7M:
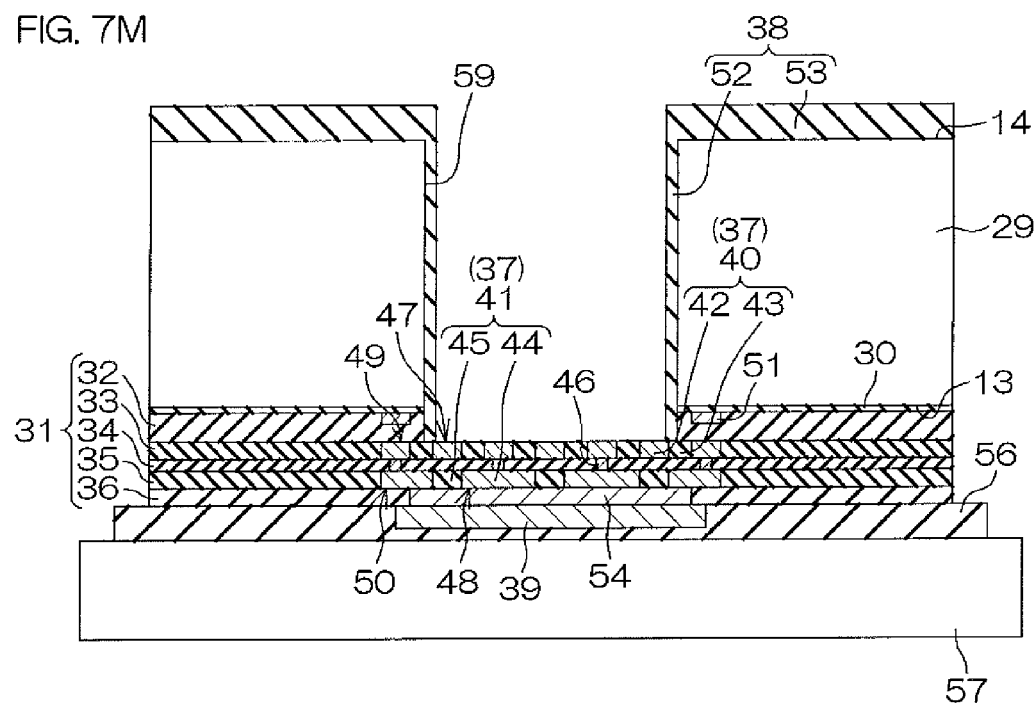
FIG. 7M is a view showing a step subsequent to the step of FIG. 7L.
Figure 7N:
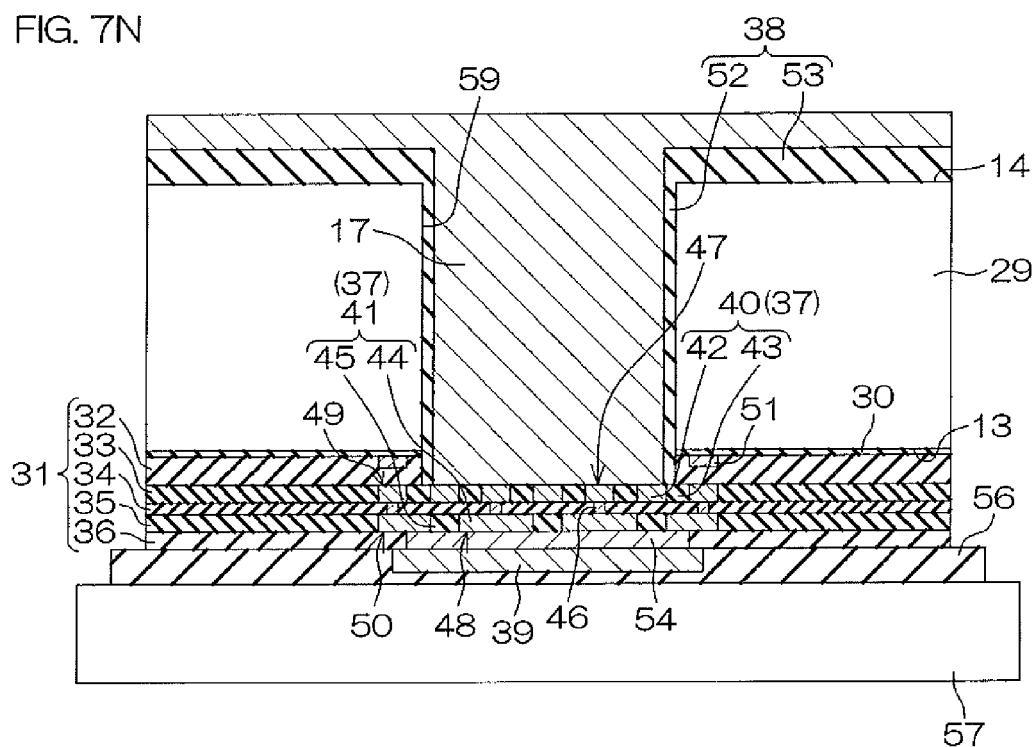
FIG. 7N is a view showing a step subsequent to the step of FIG. 7M.
Figure 70:
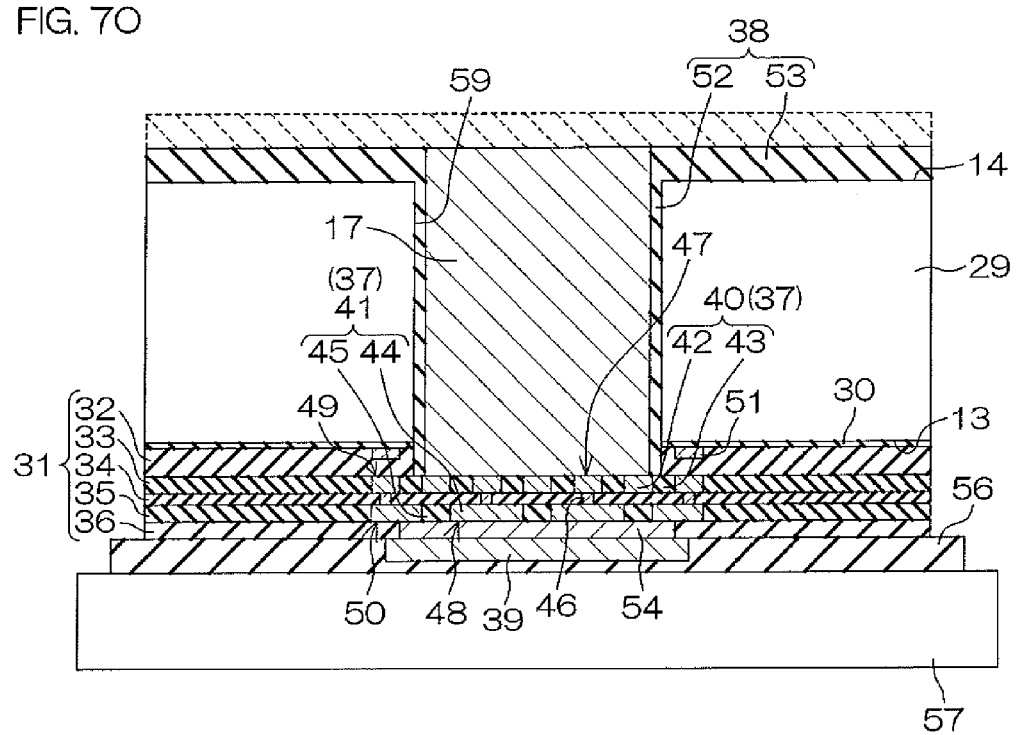
Figure 7P:
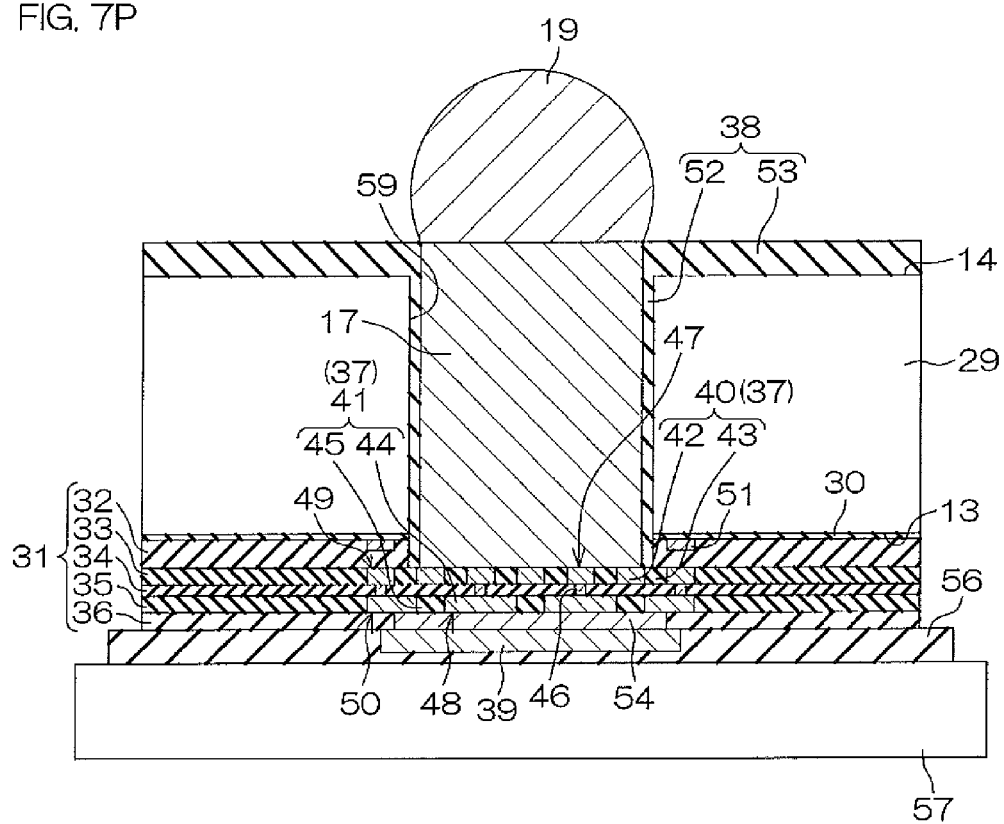
FIG. 7P is a view showing a step subsequent to the step of FIG. 7O.
Figure 7Q:
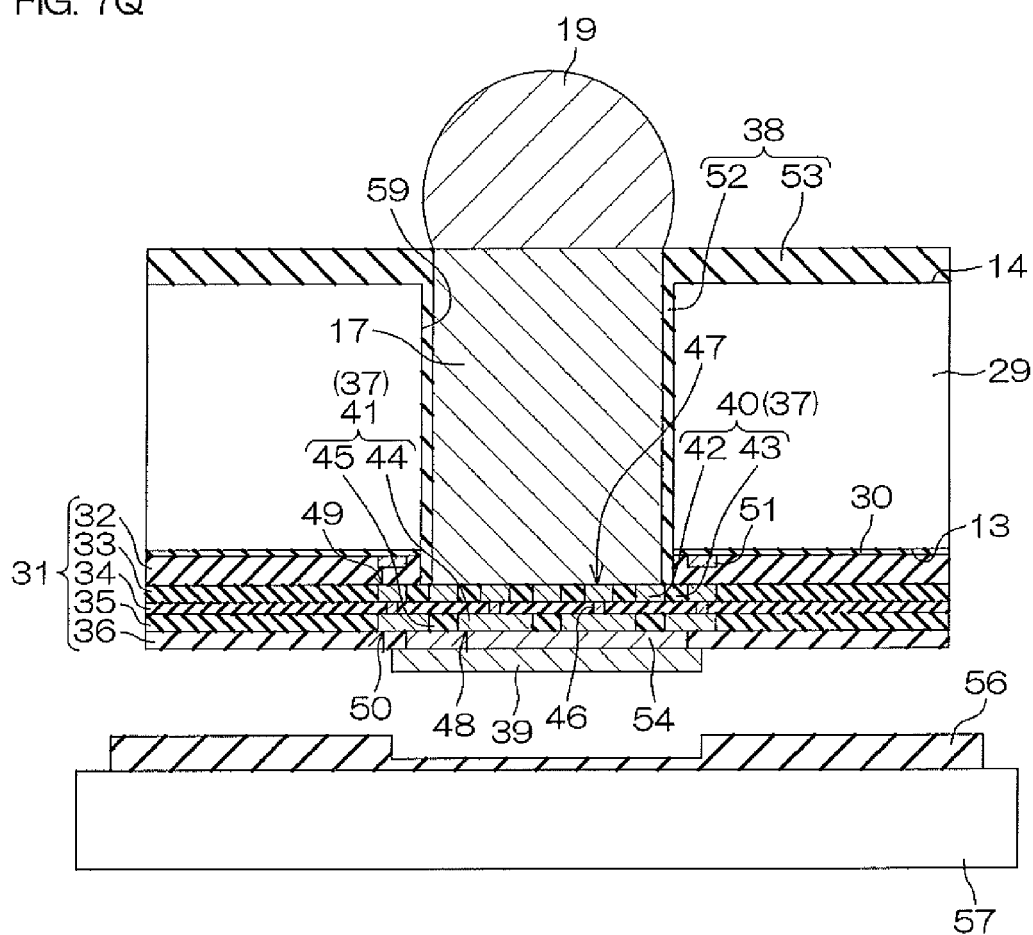
FIG. 7Q is a view showing a step subsequent to the step of FIG. 7P.

FIG. 7A to FIG. 7Q are views showing a part of a process for manufacturing the arithmetic chip 4 of FIG. 4 in process sequence.

In order to manufacture the arithmetic chip 4 of FIG. 4, first, ion implantation (e.g., n type ion and p type ion) is performed for the surface 13 of the Si substrate 29 according to a well-known method, and, as a result, an impurity region that forms a semiconductor device is formed.

Thereafter, as shown in FIG. 7A, the gate insulating film 30 is formed according to a thermal oxidation method.

Thereafter, as shown in FIG. 7B, polysilicon is deposited on the gate insulating film 30 according to a CVD method, and, as a result, the electrode layer 51 is formed simultaneously with the gate electrode of a semiconductor device (MOSFET). It is possible to efficiently form the electrode layer 51 without increasing the number of steps by forming the electrode layer 51 at the same step as the gate electrode.

Thereafter, as shown in FIG. 7C, a photoresist 55 (e.g., organic resist such as polyimide) that has an opening in an area in which the lower insulating film 43 is to be formed on the electrode layer 51.

Thereafter, as shown in FIG. 7D, etching gas is supplied to the electrode layer 51 through the photoresist 55, and the electrode layer 51 is dry etched. As a result, the electrode layer 51 is formed with the same pattern as the lower wiring line 42 (i.e., with an opposite pattern of the pattern of the lower insulating film 43). Subsequently, as shown in FIG. 7E, the photoresist 55 is removed.

Thereafter, as shown in FIG. 7F, the first interlayer insulating film 32, the second interlayer insulating film 33, the lower pad 40, the third interlayer insulating film 34, the via 46, the fourth interlayer insulating film 35, the upper pad 41, the fifth interlayer insulating film 36, the via 54, and the surface bump 39 are formed in this order on the gate insulating film 30 according to a well-known technique for manufacturing a semiconductor device, such as the damascene method, the photolithography, and the CVD. At this time, the lower pad 40 is formed according to the damascene method so that the lower wiring line 42 has the same pattern as the electrode layer 51 and so that the lower insulating film 43 has an opposite pattern of the pattern of the electrode layer 51.

Thereafter, as shown in FIG. 7G, a glass substrate 57 (support medium) is attached to the side of the surface 13 of the Si substrate 29 with an adhesive 56.

Thereafter, as shown in FIG. 7H, the Si substrate 29 is ground from the side of the reverse surface 14 (backgrinding) by use of, for example, a grinder, and the Si substrate 29 is thinned. In the present embodiment, the Si substrate 29 having a thickness of 700 μm or more is ground to be 30 μm to 50 μm.

Thereafter, as shown in FIG. 7I, a photoresist 58 (e.g., organic resist such as polyimide) that has an opening in an area in which the through electrode 17 is to be formed is formed on the reverse surface 14 of the Si substrate 29.

Thereafter, as shown in FIG. 7J, etching gas is supplied to the Si substrate 29 through the photoresist 58, and the Si substrate 29 is dry etched from the side of the reverse surface 14. This etching operation is continuously performed until the Si substrate 29, the gate insulating film 30, and a part of the electrode layer 51 (part disposed directly under the opening of the photoresist 58) are removed. As a result, the through hole 59 is formed in the Si substrate 29. Simultaneously, an etching residue is left as a projecting portion 60 that protrudes toward the opening end of the through hole 59 with the same pattern as the lower insulating film 43 in each through hole 59. The projecting portion 60 is a part which is disposed directly on the lower insulating film 43 in the first interlayer insulating film 32.

Thereafter, as shown in FIG. 7K, the first interlayer insulating film 32 that forms the bottom surface of the through hole 59 is etched in a state of leaving the photoresist 58 made when the through hole 59 is formed. This etching operation is continuously performed until the lower wiring line 42 is exposed. At this time, the projecting portion 60 of the first interlayer insulating film 32 becomes an etching margin having the same pattern as the lower insulating film 43 with respect to other parts, and therefore a part of the projecting portion 60 remains on the lower insulating film 43 as an etching residue at the time when the lower wiring line 42 is exposed.

Thereafter, as shown in FIG. 7L, the photoresist 58 is removed, and then the via insulating film 38 is formed on the inner surface of the through hole 59 and on the reverse surface 14 of the Si substrate 29 according to the CVD method so that the projecting portion 60 and the surface pad 37 (lower pad 40) exposed in the through hole 59 are covered therewith. At this time, the via insulating film 38 is leveled up by the height of the projecting portion 60 with the same pattern as the lower insulating film 43 at the position directly on the projecting portion 60 that is an etching residue (at the position directly on the lower insulating film 43). In other words, in the via insulating film 38, a level difference is generated between a part at which the projecting portion 60 is present and a part at which the projecting portion 60 is absent.

Thereafter, as shown in FIG. 7M, a part facing the opening end of the through hole 59 in the via insulating film 38 is selectively removed, i.e., a part (bottom part) on the surface pad 37 is selectively removed by performing etchback. As a result, in the through hole 59, the lower pad 40 in which the lower wiring line 42 and the lower insulating film 43 are substantially flush with each other is exposed again.

Thereafter, as shown in FIG. 7N, a seed film (e.g., Ti/Cu laminated film) is spattered on the surface of the via insulating film 38, and then Cu is plated from this seed film by means of electrolytic plating. As a result, the inside of the via insulating film 38 in the through hole 59 is filled with Cu (electrode material), and the through electrode 17 electrically connected to the surface pad 37 is formed.

Thereafter, as shown in FIG. 7O, an extra part of the through electrode 17 (i.e., part outside the through hole 59) is ground and removed according to a CMP (Chemical Mechanical Polishing) method until a ground surface becomes flush with the reverse portion 53 of the via insulating film 38.

Thereafter, as shown in FIG. 7P, the reverse bump 19 is formed one by one for each through electrode 17, and, as shown in FIG. 7Q, the arithmetic chip 4 of FIG. 4 can be obtained by detaching the Si substrate 29 from the glass substrate 57.

As described above, according to the method of the present embodiment, the steps of FIG. 7A to FIG. 7E are followed, and the electrode layer 51 having an opposite pattern of the pattern of the lower insulating film 43 of the lower pad 40 connected directly to the through electrode 17 (exposed in the through hole 59) in the multi-layer surface pads 37 is beforehand formed.

As a result, an etching residue positioned directly on the lower insulating film 43 in the first interlayer insulating film 32 can be left as the projecting portion 60 that protrudes toward the opening end of the through hole 59 with the same pattern as the lower insulating film 43 when the through hole 59 is formed by etching the Si substrate 29 from the reverse surface 14 toward the surface pad 37 at the step of FIG. 7J.

Therefore, the via insulating film 38 is leveled up by the height of the projecting portion 60 with the same pattern as the lower insulating film 43 at the position directly on the projecting portion 60 of the etching residue (at the position directly on the lower insulating film 43) when the via insulating film 38 is formed at the step of FIG. 7L. In other words, in the via insulating film 38, a level difference is generated between a part at which the projecting portion 60 is present and a part at which the projecting portion 60 is absent.

At the etching step of the via insulating film 38 of FIG. 7M, a part of the via insulating film 38 that has been leveled up becomes an etching margin having the same pattern as the lower insulating film 43 with respect to a part that has not been leveled up, and therefore, even if the via insulating film 38 is etched until the lower wiring line 42 is exposed, it is possible to completely eliminate or reduce the amount of etching of the lower insulating film 43 brought by this etching operation.

As a result, a level difference can be prevented from occurring between the lower wiring lines 42 of the lower pad 40. Therefore, when Cu is plated at the step of FIG. 7N, a seed film can be formed on the inner surface of the through hole 59 with excellent coating ability, and therefore the occurrence of voids can be prevented.

Conversely, there is a fear that a seed film for plating growth will not be excellently formed at the stepped part having a level difference if the lower insulating film 43 is etched and removed along with the via insulating film 38 and if a level difference occurs between the lower wiring lines 42 when the via insulating film 38 is etched. As a result, there is a case in which voids occur near the stepped part between the lower wiring lines 42 in the through electrode 17 that has undergone plating growth.

On the other hand, in the arithmetic chip 4 of FIG. 4, voids can be prevented from occurring in the through electrode 17, and therefore a semiconductor chip having higher reliability than conventional ones can be realized.

According to the electronic component 1 of FIG. 1, the arithmetic chip 4 and the Si interposer 5 capable of preventing the occurrence of the aforementioned voids are mounted, and therefore an electronic component having higher reliability than conventional ones can be realized.

FIG. 8 is a schematic sectional view to describe a structure of the arithmetic chip 4 of FIG. 1 (second embodiment), enlarging a part at which the through electrode 17 is disposed. In FIG. 8, the same reference sign as in FIG. 4 is given to an element corresponding to each element shown in FIG. 4. Hereinafter, a detailed description of an element to which the same reference sign is given is omitted.

In the arithmetic chip 4 of FIG. 8, the electrode layer 51 is not formed, and, instead, an insulating layer 61 selectively embedded in the surface 13 of the Si substrate 29 on the side of the reverse surface 14 is formed with the same stripe pattern as the lower insulating film 43 of the projecting portion 49 of the lower pad 40.

Figure 9A:
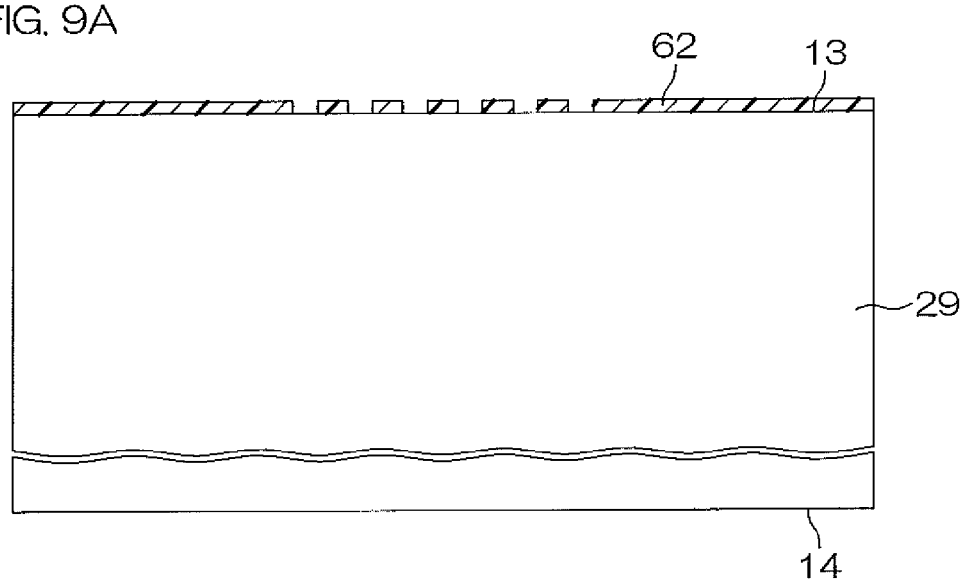
FIG. 9A is a view showing a part of a process for manufacturing the arithmetic chip of FIG. 8.

FIG. 9A to FIG. 9P are views showing a part of a process for manufacturing the arithmetic chip of FIG. 8 in process sequence.

In order to manufacture the arithmetic chip 4 of FIG. 8, first, a photoresist 62 that has an opening with the same pattern (opposite pattern of the pattern of the lower wiring line 42) as the lower insulating film 43 is formed on the surface 13 of the Si substrate 29 that has a thickness of 700 µm or more as shown in FIG. 9A.

Figure 9B:
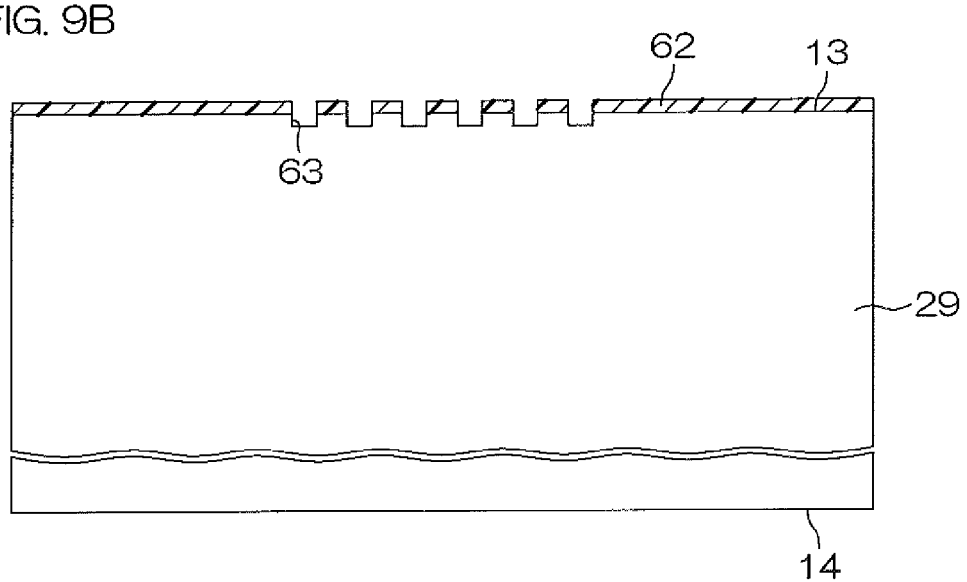
FIG. 9B is a view showing a step subsequent to the step of FIG. 9A.

Thereafter, as shown in FIG. 9B, etching gas is supplied to the Si substrate 29 through the photoresist 62, and the Si substrate 29 is dry etched from the side of the surface 13. As a result, a shallow trench 63 having this pattern is formed.

Figure 9C:
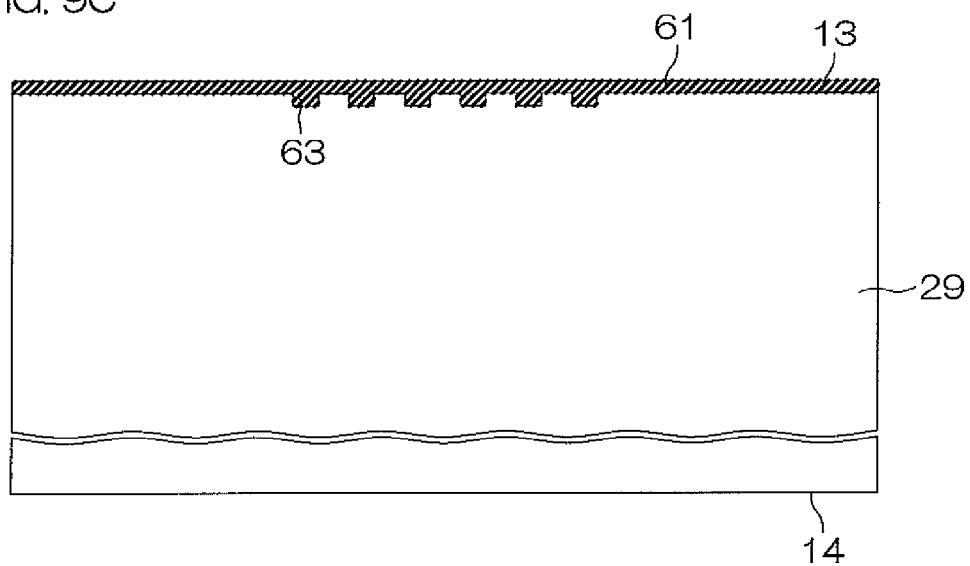
FIG. 9C is a view showing a step subsequent to the step of FIG. 9B.

Thereafter, as shown in FIG. 9C, the shallow trench 63 is filled with $SiO_2$ (insulation material) according to the CVD method.

Figure 9D:
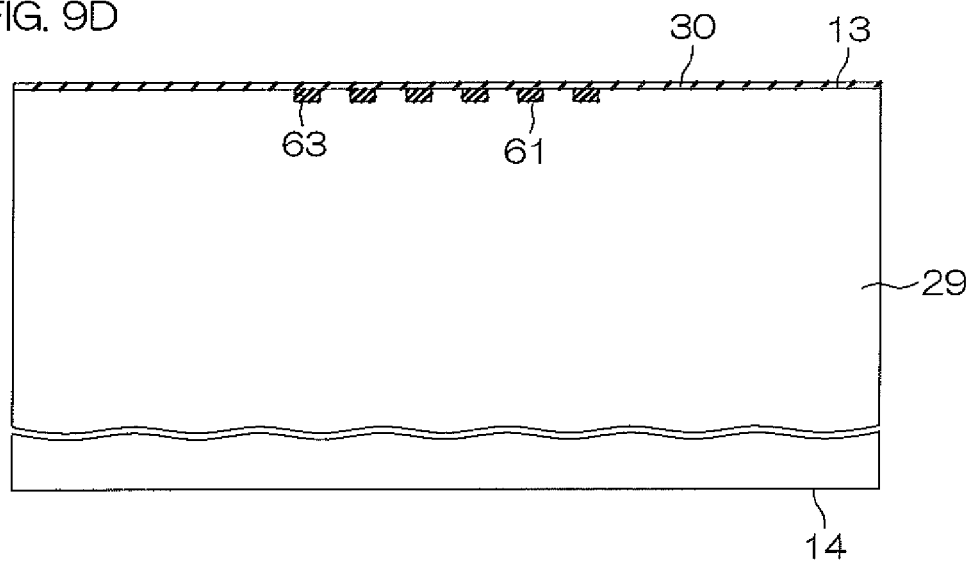
FIG. 9D is a view showing a step subsequent to the step of FIG. 9C.

Thereafter, as shown in FIG. 9D, $SiO_2$ outside the shallow trench 63 is removed by CMP, and, as a result, the insulating layer 61 embedded in the Si substrate 29 is formed. These steps of forming the insulating layer 61 shown by FIG. 9A to FIG. 9D can be performed at the same steps as the steps of forming a plurality of element isolation regions in the Si substrate 29, for example, by an STI (Shallow Trench Isolation) step, and therefore the insulating layer 61 can be efficiently formed. Subsequently, the gate insulating film 30 is formed by thermal oxidation.

Figure 9E:
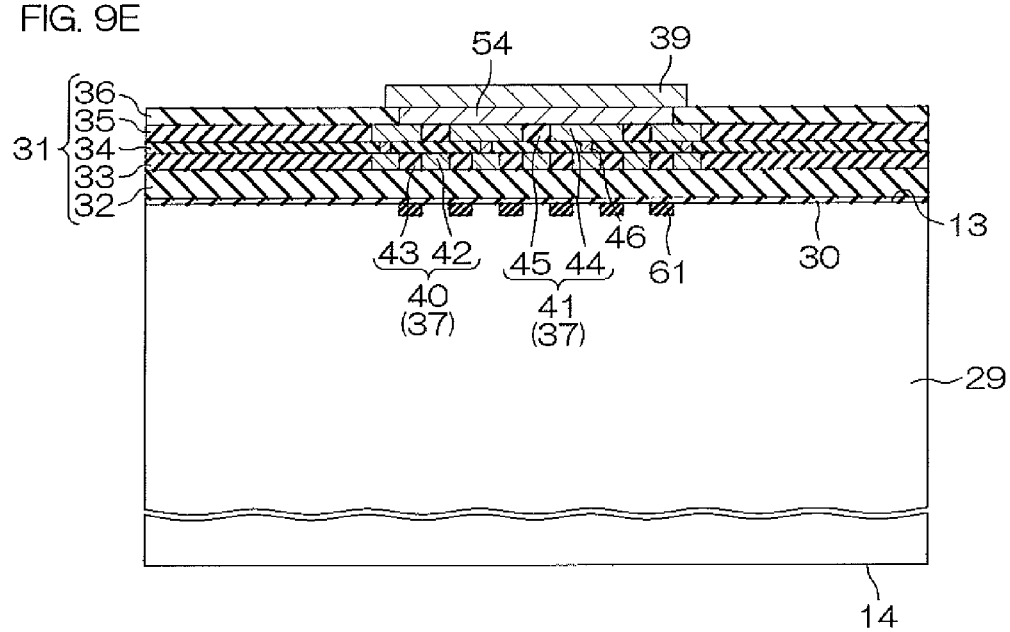
FIG. 9E is a view showing a step subsequent to the step of FIG. 9D.

Thereafter, as shown in FIG. 9E, the first interlayer insulating film 32, the second interlayer insulating film 33, the lower pad 40, the third interlayer insulating film 34, the via 46, the fourth interlayer insulating film 35, the upper pad 41, the fifth interlayer insulating film 36, the via 54, and the surface bump 39 are formed in this order on the gate insulating film 30 according to a well-known technique for manufacturing a semiconductor device, such as the damascene method, the photolithography, and the CVD. At this time, the lower pad 40 is formed according to the damascene method so that the lower wiring line 42 has an opposite pattern of the pattern of the insulating layer 61 and so that the lower insulating film 43 has the same pattern as the insulating layer 61.

Figure 9F:
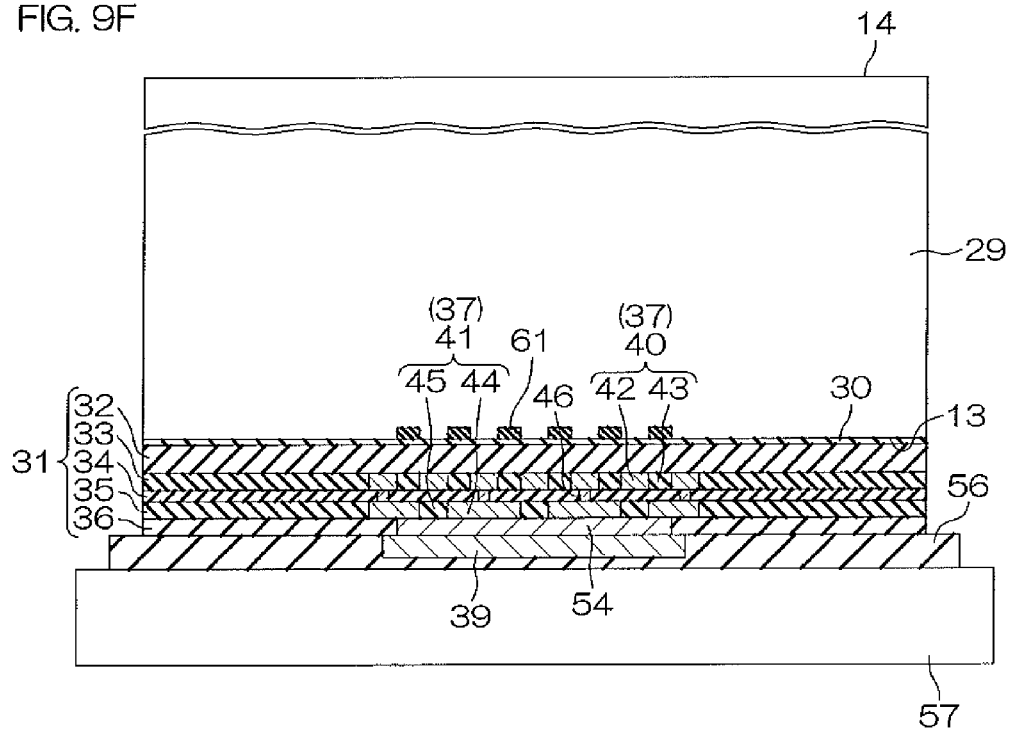
FIG. 9F is a view showing a step subsequent to the step of FIG. 9E.

Thereafter, as shown in FIG. 9F, the glass substrate 57 (support medium) is attached to the side of the surface 13 of the Si substrate 29 with an adhesive 56.

Figure 9G:
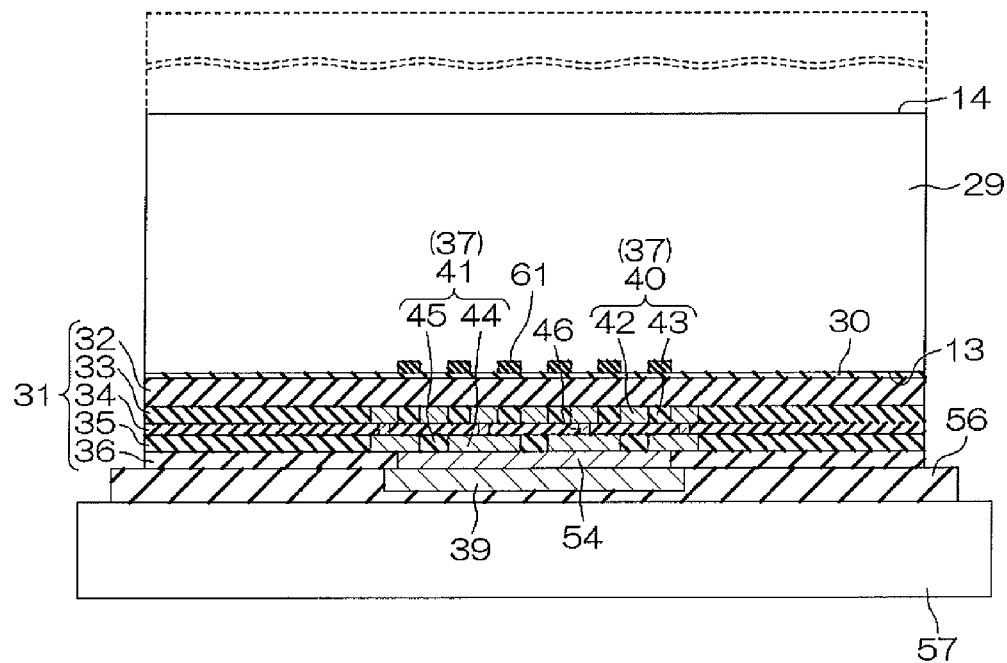
FIG. 9G is a view showing a step subsequent to the step of FIG. 9F.

Thereafter, as shown in FIG. 9G, the Si substrate 29 is ground from the side of the reverse surface 14 (back-grinding) by use of, for example, a grinder, and the Si substrate 29 is thinned. In the present embodiment, the Si substrate 29 having a thickness of 700 µm or more is ground to be 30 µm to 50 µm.

Figure 9H:
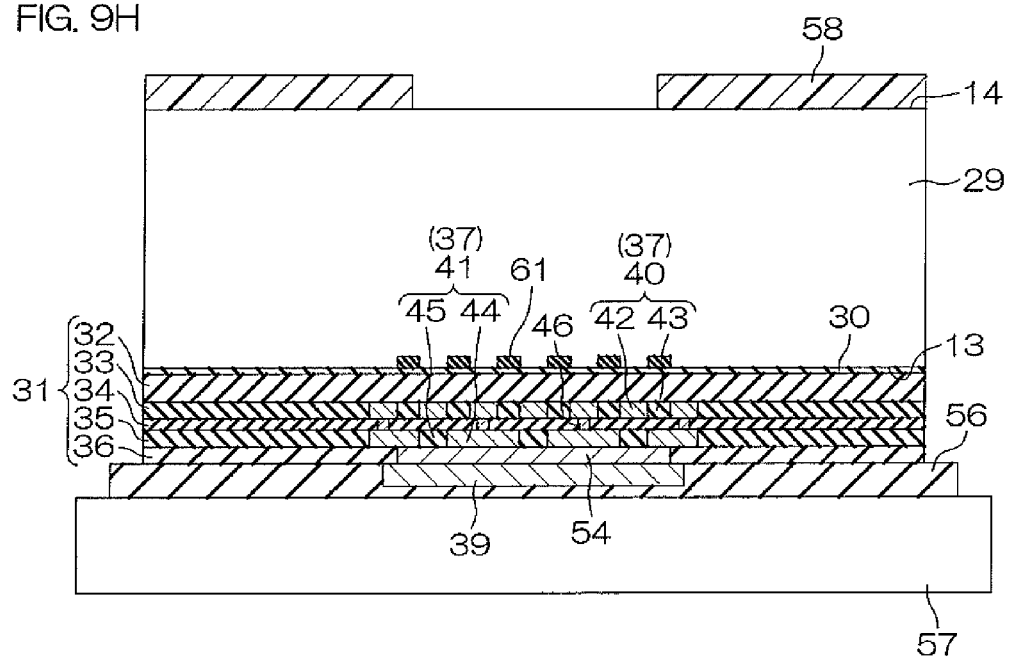
FIG. 9H is a view showing a step subsequent to the step of FIG. 9G.
Figure 9:
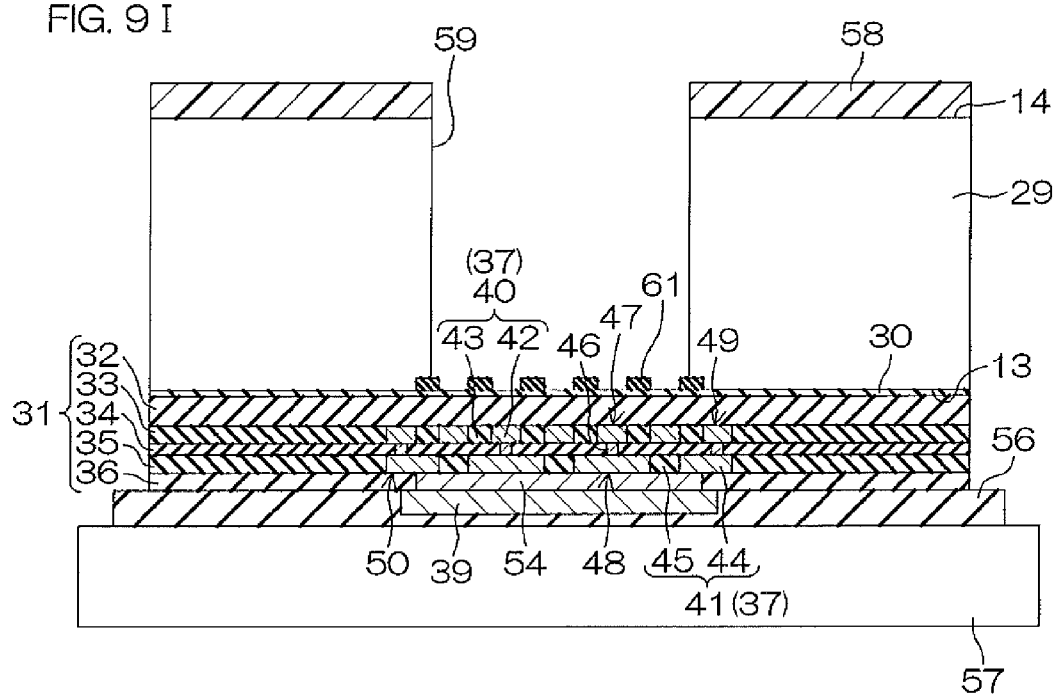
FIG. 9I is a view showing a step subsequent to the step of FIG. 9H.
FIG. 9J is a view showing a step subsequent to the step of FIG. 9I.
FIG. 9K is a view showing a step subsequent to the step of FIG. 9J.
FIG. 9L is a view showing a step subsequent to the step of FIG. 9K.
FIG. 9M is a view showing a step subsequent to the step of FIG. 9L.
FIG. 9N is a view showing a step subsequent to the step of FIG. 9M.
FIG. 9O is a view showing a step subsequent to the step of FIG. 9N.
FIG. 9P is a view showing a step subsequent to the step of FIG. 9O.

Thereafter, as shown in FIG. 9H, a photoresist 58 (e.g., organic resist such as polyimide) that has an opening in an area in which the through electrode 17 is to be formed is formed on the reverse surface 14 of the Si substrate 29.

Thereafter, as shown in FIG. 9I, etching gas is supplied to the Si substrate 29 through the photoresist 58, and the Si substrate 29 is dry etched from the side of the reverse surface 14. This etching operation is continuously performed until the Si substrate 29 is removed and until the insulating layer 61 and the gate insulating film 30 is exposed. As a result, the through hole 59 is formed in the Si substrate 29. Simultaneously, in each through hole 59, the insulating layer 61 is left as a projecting portion that protrudes toward the opening end of the through hole 59 with the same pattern as the lower insulating film 43.

Figure 9J:
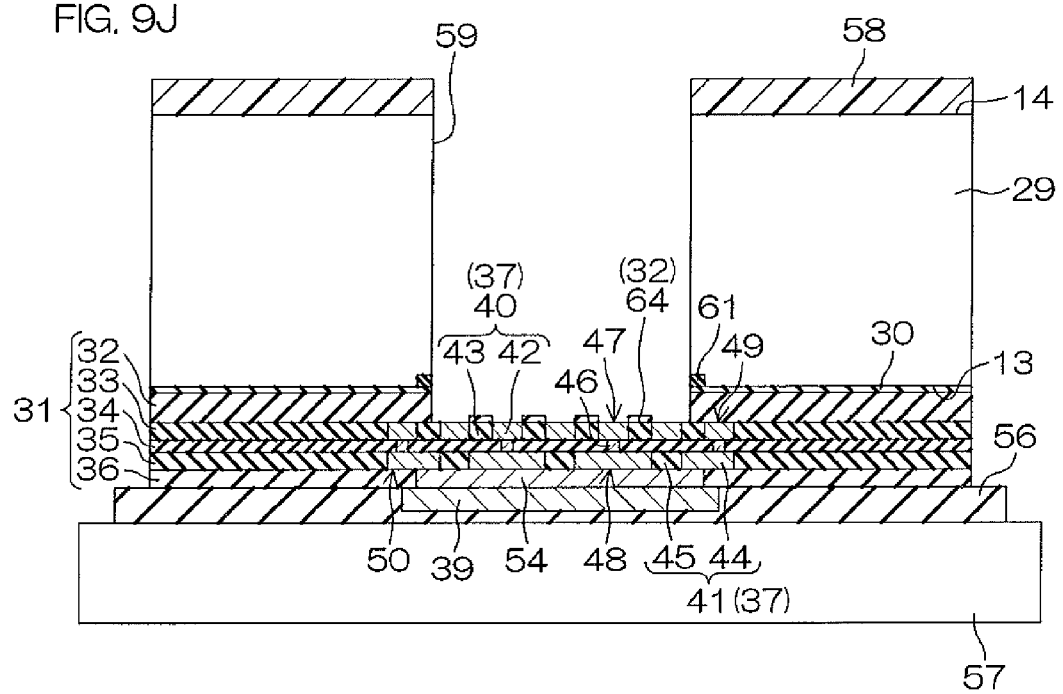

Thereafter, as shown in FIG. 9J, the insulating layer 61, the gate insulating film 30, and the first interlayer insulating film 32 that form the bottom surface of the through hole 59 is etched in a state of leaving the photoresist 58 made when the through hole 59 is formed. This etching operation is continuously performed until the lower wiring line 42 is exposed. At this time, a part at which the insulating layer 61 is formed becomes an etching margin having the same pattern as the lower insulating film 43 with respect to other parts, and therefore a part directly under the insulating layer 61 in the first interlayer insulating film 32 remains on the lower insulating film 43 as a projecting portion 64 (etching residue) at the time when the lower wiring line 42 is exposed.

Figure 9K:
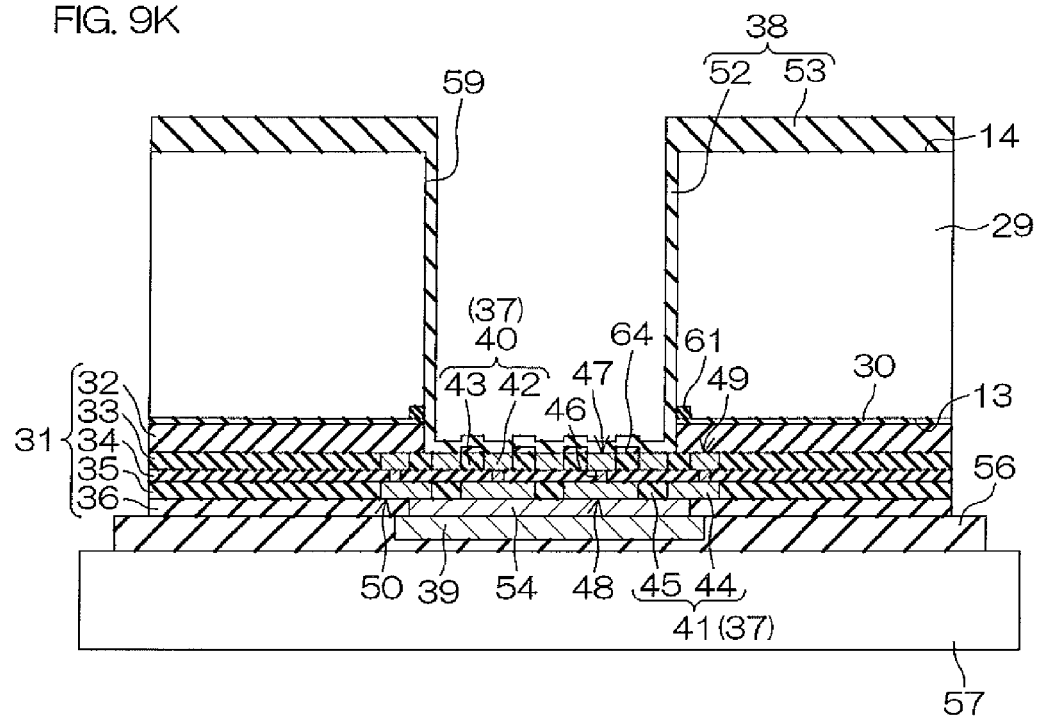

Thereafter, as shown in FIG. 9K, the photoresist 58 is removed, and then the via insulating film 38 is formed on the inner surface of the through hole 59 and on the reverse surface 14 of the Si substrate 29 according to the CVD method so that the projecting portion 64 (first interlayer insulating film 32) and the surface pad 37 (lower pad 40) exposed in the through hole 59 are covered therewith. At this time, the via insulating film 38 is leveled up by the height of the projecting portion 60 with the same pattern as the lower insulating film 43 at the position directly on the projecting portion 64 (at the position directly on the lower insulating film 43). In other words, in the via insulating film 38, a level difference is generated between a part at which the projecting portion 64 is present and a part at which the projecting portion 64 is absent.

Figure 9L:
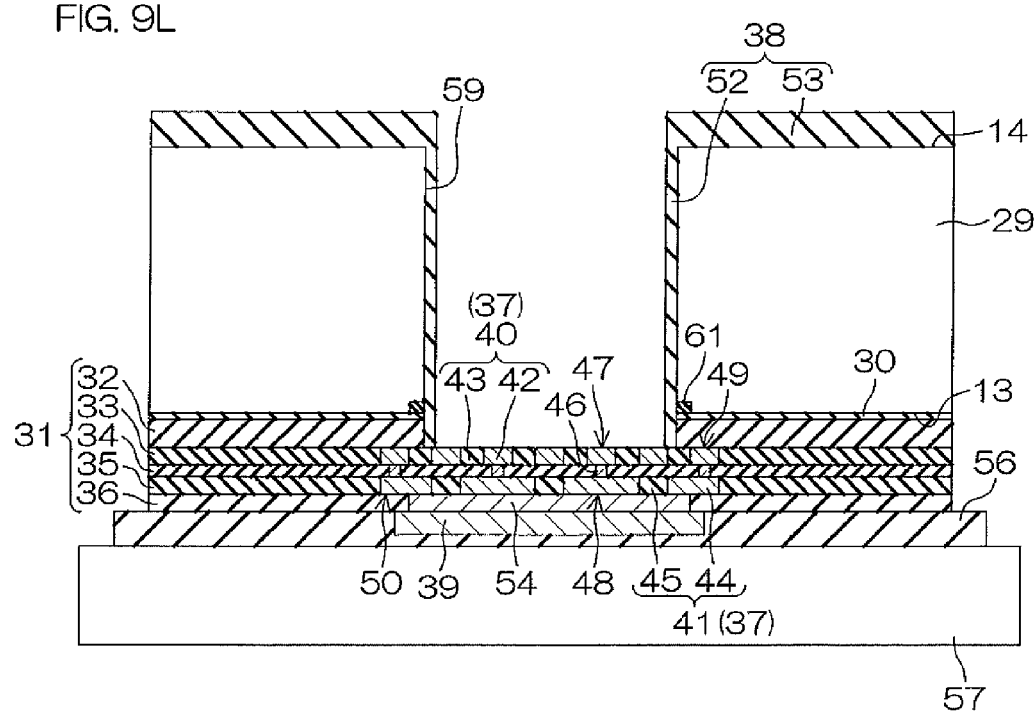

Thereafter, as shown in FIG. 9L, a part facing the opening end of the through hole 59 in the via insulating film 38 is selectively removed, i.e., a part (bottom part) on the surface pad 37 is selectively removed by performing etchback. As a result, in the through hole 59, the lower pad 40 in which the lower wiring line 42 and the lower insulating film 43 are substantially flush with each other is exposed again.

Figure 9M:
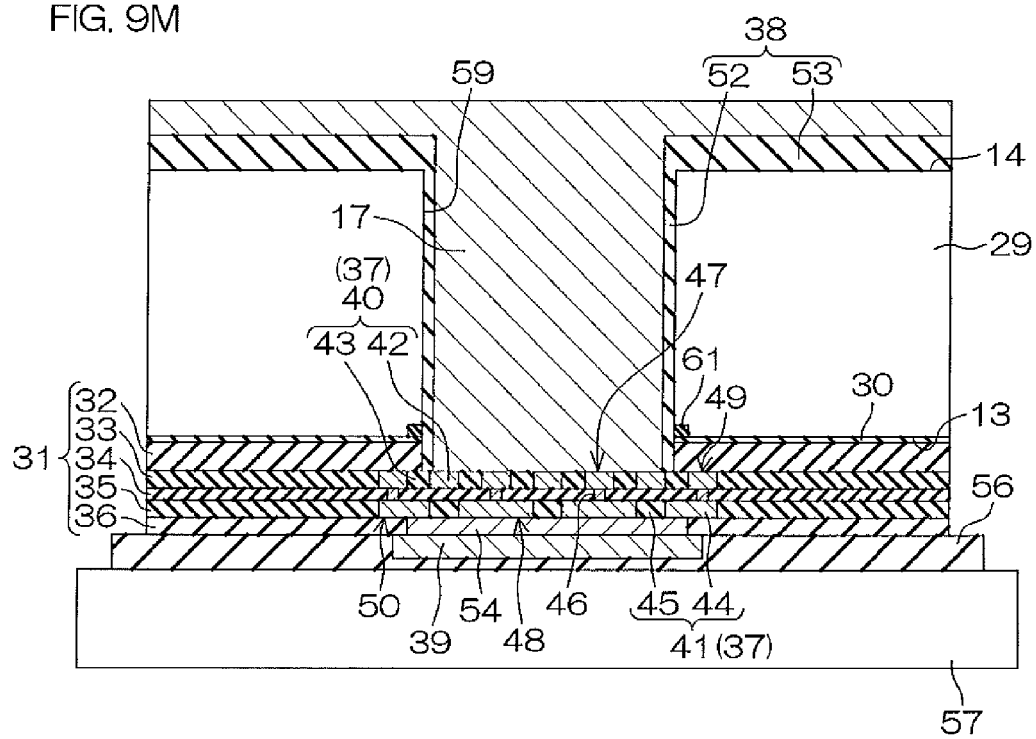

Thereafter, as shown in FIG. 9M, a seed film (e.g., Ti/Cu laminated film) is spattered on the surface of the via insulating film 38, and then Cu is plated from this seed film by means of electrolytic plating. As a result, the inside of the via insulating film 38 in the through hole 59 is filled with Cu (electrode material), and the through electrode 17 electrically connected to the surface pad 37 is formed.

Figure 9N:
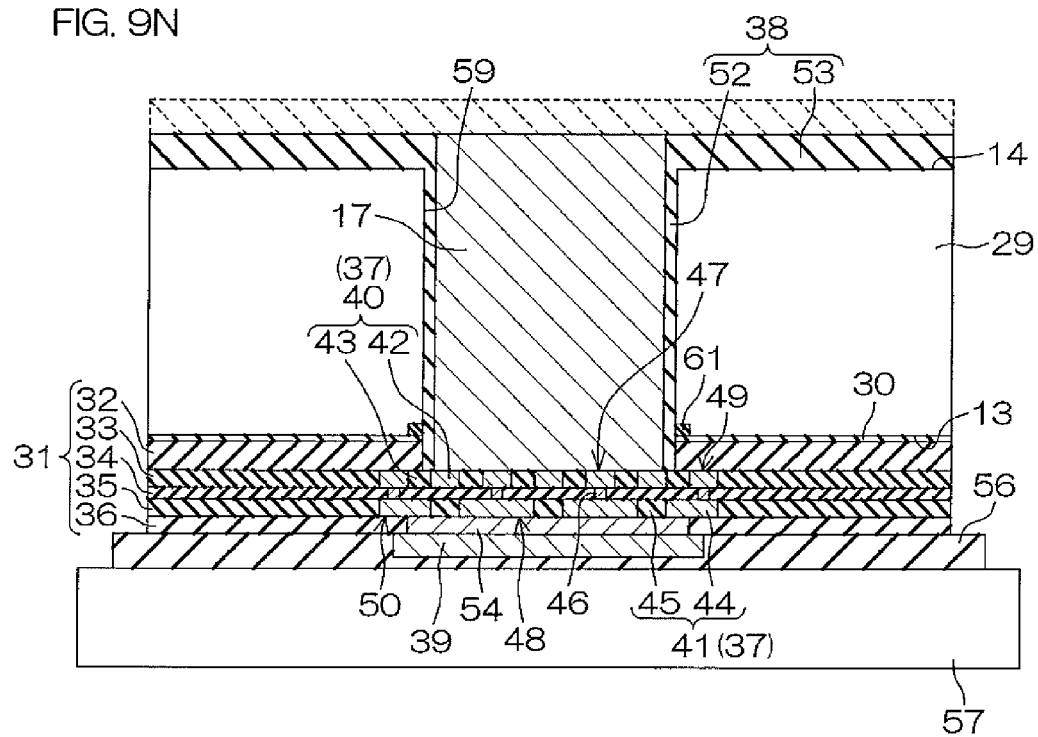

Thereafter, as shown in FIG. 9N, an extra part of the through electrode 17 (i.e., part outside the through hole 59) is ground and removed according to the CMP (Chemical Mechanical Polishing) method until a ground surface becomes flush with the reverse portion 53 of the via insulating film 38.

Figure 9O:
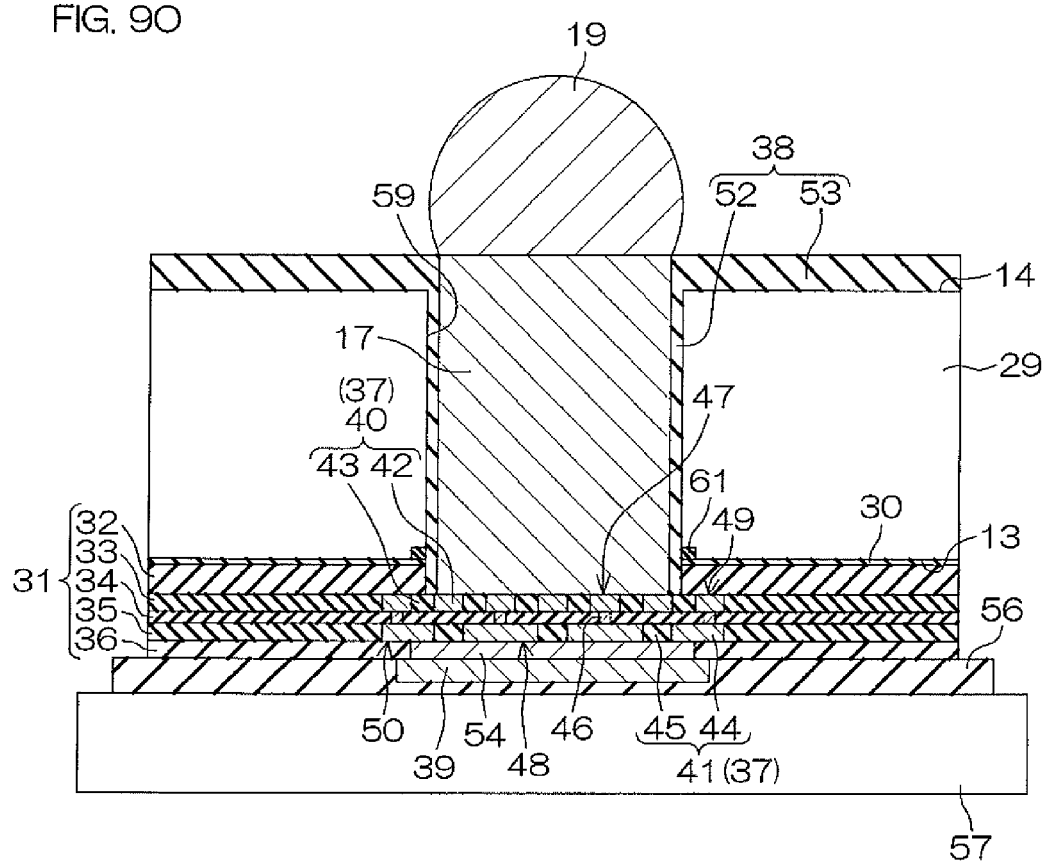

Thereafter, as shown in FIG. 9O, the reverse bump 19 is formed one by one for each through electrode 17, and, as shown in FIG. 9P, the arithmetic chip 4 of FIG. 8 can be obtained by detaching the Si substrate 29 from the glass substrate 57.

As described above, according to the method of the present embodiment, the steps of FIG. 9A to FIG. 9D are followed, and the insulating layer 61 having the same pattern as the lower insulating film 43 of the lower pad 40 connected directly to the through electrode 17 (exposed in the through hole 59) in the multi-layer surface pads 37 is beforehand formed.

As a result, the insulating layer 61 can be left as an etching residue that protrudes toward the opening end of the through hole 59 with the same pattern as the lower insulating film 43 when the through hole 59 is formed by etching the Si substrate 29 from the reverse surface 14 toward the surface pad 37 at the step of FIG. 9I.

Therefore, the via insulating film 38 is leveled up by the height of the projecting portion 64 with the same pattern as the lower insulating film 43 at the position directly on the projecting portion 64 of the etching residue (at the position directly on the lower insulating film 43) when the via insulating film 38 is formed at the step of FIG. 9K. In other words, in the via insulating film 38, a level difference is generated between a part at which the projecting portion 64 is present and a part at which the projecting portion 64 is absent.

At the etching step of the via insulating film 38 of FIG. 9L, a part of the via insulating film 38 that has been leveled up becomes an etching margin having the same pattern as the lower insulating film 43 with respect to a part that has not been leveled up. Therefore, even if the via insulating film 38 is etched until the lower wiring line 42 is exposed, it is possible to completely eliminate or reduce the amount of etching of the lower insulating film 43 brought by this etching operation.

As a result, a level difference can be prevented from occurring between the lower wiring lines 42 of the lower pad 40. Therefore, when Cu is plated at the step of FIG. 9M, a seed film can be formed on the inner surface of the through hole 59 with excellent coating ability, and therefore the occurrence of voids can be prevented.

As a result, in the arithmetic chip 4 of FIG. 8, voids can be prevented from occurring in the through electrode 17, and a semiconductor chip having higher reliability than conventional ones can be realized.

Although the embodiments of the present invention have been described as above, the present invention can be embodied in other modes.

For example, the through electrode 17 may be formed in an elliptic cylindrical shape, a quadrangular cylindrical shape, a hexagonal cylindrical shape, or an octagonal cylindrical shape.

Additionally, although the step of forming the electrode layer 51 was performed at the same step as the step of forming the gate electrode of the semiconductor device (MOSFET) at the steps of FIG. 7A to FIG. 7E, this may be performed independently.

Additionally, although the step of forming the insulating layer 61 was performed at the same step as the STI step of forming the element isolation region in the Si substrate 29 at the steps of FIG. 9A to FIG. 9D, this may be performed independently.

Furthermore, various design changes can be made within the scope of the appended claims.

REFERENCE SIGNS LIST

1 Electronic component
2 Resin interposer
3 Surface (of resin interposer)
4 Arithmetic chip
5 Si interposer
6 Memory chip
7 Resin package
8 Power-supply wiring line
9 Signal-system wiring line
10 Reverse surface (of resin interposer)
11 Outside terminal
12 Logic control circuit
13 Surface (of arithmetic chip)
14 Reverse surface (of arithmetic chip)
15 Surface (of Si interposer)
16 Reverse surface (of Si interposer)
17 Through electrode (of arithmetic chip)
18 Through electrode (of Si interposer)
19 Reverse bump (of arithmetic chip)
20 Reverse bump (of Si interposer)
22 Control circuit
23 Reverse surface (of memory chip)
24 Reverse bump (of memory chip)
25 Central part (of arithmetic chip)
26 Peripheral edge (of arithmetic chip)
27 Central part (of Si interposer)
28 Peripheral edge (of Si interposer)
29 Si substrate
30 Gate insulating film
31 Interlayer insulating film
32 First interlayer insulating film
33 Second interlayer insulating film
34 Third interlayer insulating film
35 Fourth interlayer insulating film
36 Fifth interlayer insulating film
37 Surface pad
38 Via insulating film
39 Surface bump
40 Lower pad
41 Upper pad
42 Lower wiring line
43 Lower insulating film
44 Upper wiring line
45 Upper insulating film
46 Via
47 Facing portion (of lower pad)
48 Facing portion (of upper pad)
49 Projecting portion (of lower pad)
50 Projecting portion (of upper pad)
51 Electrode layer
52 Main portion (of via insulating film)
53 Reverse portion (of via insulating film)
54 Via
55 Photoresist
56 Adhesive
57 Glass substrate
58 Photoresist
59 Through hole
60 Projecting portion
61 Insulating layer
62 Photoresist
63 Shallow trench
64 Projecting portion

The invention claimed is:

1. A semiconductor device comprising:
a semiconductor substrate;
a gate insulating film formed on a surface of the semiconductor substrate;
an interlayer insulating film formed on the gate insulating film;
a surface electrode including a plurality of wiring lines having a damascene structure selectively embedded in the interlayer insulating film with a predetermined pattern and a between-wiring-lines insulating film disposed between the wiring lines adjoining each other, a part of the interlayer insulating film forming the between-wiring-lines insulating film;
a through electrode penetrating the semiconductor substrate and electrically connected to the surface electrode; and
a via insulating film disposed between the through electrode and the semiconductor substrate,
wherein the wiring lines and the between-wiring-lines insulating film are formed to be flush with each other in a connection surface of the wiring lines and the between-wiring-lines insulating film with the through electrode, wherein the surface electrode further includes a facing portion facing the through electrode, a projecting portion projecting in a lateral direction from the facing portion, and an electrode layer disposed between the gate insulating film and the interlayer insulating film and having a same pattern as one of the wiring lines forming the projecting portion.

2. The semiconductor device according to claim 1, wherein the wiring lines and the between-wiring-lines insulating film are alternately arranged in a stripe manner in the surface electrode.

3. The semiconductor device according to claim 1, wherein the wiring lines includes a Cu wiring line.

4. The semiconductor device according to claim 1, wherein the interlayer insulating film includes interlayer insulating films, the surface electrode includes multi-layer electrodes between which the interlayer insulating films are interposed and are stacked together.

5. The semiconductor device according to claim 1, wherein the semiconductor device includes a surface bump for external connection disposed at a position directly on the through electrode so that the surface electrode is placed between the surface bump and the through electrode.

6. The semiconductor device according to claim 1, wherein the semiconductor device includes a reverse bump for external connection disposed at an end on a reverse surface side of the through electrode.

7. The semiconductor device according to claim 1, wherein the through electrode is formed in a cylindrical shape.

8. The semiconductor device according to claim 1, wherein the surface of the semiconductor substrate includes a device-forming surface on which a plurality of semiconductor devices are formed.

9. An electronic component comprising:

an interposer having a plurality of outside terminals on a reverse surface thereof;

the semiconductor device of claim 1 laid on a surface of the interposer in a posture in which the surface of the interposer is directed upwardly;

a second semiconductor device having a plurality of reverse bumps and laid on the surface of the semiconductor device so that the reverse bumps are electrically connected to the through electrode; and a resin package sealing the semiconductor device and the second semiconductor device.

10. An electronic component comprising:

an interposer having a plurality of outside terminals on a reverse surface thereof;

the semiconductor device of claim 1 laid on a surface of the interposer in a posture in which the surface of the semiconductor substrate is directed upwardly;

a second semiconductor device having a plurality of reverse bumps and laid on the surface of the semiconductor device so that the reverse bumps are electrically connected to the through electrode; and a resin package sealing the semiconductor device and the second semiconductor device.

11. A semiconductor device comprising:

a semiconductor substrate;

a gate insulating film formed on a surface of the semiconductor substrate;

an interlayer insulating film formed on the gate insulating film;

a surface electrode including a plurality of wiring lines having a damascene structure selectively embedded in the interlayer insulating film with a predetermined pattern and a between-wiring-lines insulating film disposed between the wiring lines adjoining each other, a part of the interlayer insulating film forming the between-wiring-lines insulating film;

a through electrode penetrating the semiconductor substrate and electrically connected to the surface electrode; and a via insulating film disposed between the through electrode and the semiconductor substrate, wherein the wiring lines and the between-wiring-lines insulating film are formed to be flush with each other in a connection surface of the wiring lines and the between-wiring-lines insulating film with the through electrode, wherein the surface electrode further includes a facing portion facing the through electrode, a projecting portion projecting in a lateral direction from the facing portion, and an insulating layer embedded in the surface of the semiconductor substrate and having a same pattern as the between-wiring-lines insulating film which forms the projecting portion.

12. The semiconductor device according to claim 11, wherein the wiring lines and the between-wiring-lines insulating film are alternately arranged in a stripe manner in the surface electrode.

* * * * *